United States Patent
Hashimoto

(10) Patent No.: US 8,399,999 B2
(45) Date of Patent: Mar. 19, 2013

(54) ELECTRONIC COMPONENT, SEMICONDUCTOR DEVICE, METHODS OF MANUFACTURING THE SAME, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 132 days.

(21) Appl. No.: 12/983,733

(22) Filed: Jan. 3, 2011

(65) Prior Publication Data

US 2011/0095422 A1    Apr. 28, 2011

Related U.S. Application Data

(63) Continuation of application No. 12/794,401, filed on Jun. 4, 2010, now Pat. No. 7,888,177, which is a continuation of application No. 12/343,166, filed on Dec. 23, 2008, now Pat. No. 7,755,205, which is a continuation of application No. 11/976,835, filed on (Continued)

(30) Foreign Application Priority Data

Jan. 17, 1997   (JP) ........................................ 9-19915

(51) Int. Cl.
*H01L 23/495* (2006.01)
(52) U.S. Cl. . 257/784; 257/758; 257/773; 257/E23.043; 257/E23.047; 257/E23.045
(58) Field of Classification Search .................. 257/784, 257/758, 773, E23.043, E23.047, E23.045
See application file for complete search history.

(56) References Cited

U.S. PATENT DOCUMENTS

| | | | |
|---|---|---|---|
| 3,495,324 A | 2/1970 | Guthrie et al. | |
| 4,087,314 A | 5/1978 | George et al. | |
| 4,723,197 A | 2/1988 | Takiar et al. | |
| 4,734,568 A | 3/1988 | Watanabe | |
| 4,743,568 A | 5/1988 | Wood | |
| 5,016,087 A * | 5/1991 | Haug et al. | 257/750 |
| 5,017,510 A | 5/1991 | Welch et al. | |
| 5,046,161 A | 9/1991 | Takada | |
| 5,126,820 A | 6/1992 | Brown | |
| 5,148,266 A | 9/1992 | Khandros et al. | |

(Continued)

FOREIGN PATENT DOCUMENTS

| | | |
|---|---|---|
| EP | 0 275 588 A1 | 7/1988 |
| EP | 0 286 829 A2 | 10/1988 |

(Continued)

OTHER PUBLICATIONS

Notice of Allowance for U.S. Appl. No. 12/794,401 mailed Oct. 1, 2010.

*Primary Examiner* — Victor A Mandala
(74) *Attorney, Agent, or Firm* — Oliff & Berridge, PLC

(57) ABSTRACT

An electronic component including an electronic element, an electrode that is formed on a first surface of the electronic element, a first resin layer that is formed over the first surface of the electronic element, a wiring that is electrically connected to the electrode, a first portion of the wiring extending over the first resin layer, a second resin layer that is formed over the first resin layer and the wiring, the second resin layer having an opening, the opening overlapping the first portion of the wiring, an external terminal that is provided above the second resin layer, the external terminal being connected to the first portion of the wiring via the opening, and a third resin layer that is formed over the second resin layer, the third resin layer being provided around the external terminal.

20 Claims, 15 Drawing Sheets

Related U.S. Application Data

Oct. 29, 2007, now Pat. No. 7,485,973, which is a continuation of application No. 11/785,880, filed on Apr. 20, 2007, now Pat. No. 7,307,351, which is a continuation of application No. 10/331,510, filed on Dec. 31, 2002, now Pat. No. 7,235,881, which is a continuation of application No. 09/953,858, filed on Sep. 18, 2001, now Pat. No. 6,518,651, which is a continuation of application No. 09/142,856, filed as application No. PCT/JP98/00130 on Jan. 16, 1998, now Pat. No. 6,323,542.

(56) References Cited

U.S. PATENT DOCUMENTS

| | | | |
|---|---|---|---|
| 5,435,482 A * | 7/1995 | Variot et al. | 228/254 |
| 5,507,403 A | 4/1996 | Sakemura et al. | |
| 5,563,102 A | 10/1996 | Michael | |
| 5,604,379 A | 2/1997 | Mori | |
| 5,641,113 A | 6/1997 | Somaki et al. | |
| 5,656,863 A | 8/1997 | Yasunaga et al. | |
| 5,666,270 A | 9/1997 | Matsuda et al. | |
| 5,691,248 A * | 11/1997 | Cronin et al. | 438/109 |
| 5,753,974 A | 5/1998 | Masukawa | |
| 5,757,079 A | 5/1998 | McAllister et al. | |
| 5,834,844 A | 11/1998 | Akagawa et al. | |
| 5,960,308 A | 9/1999 | Akagawa et al. | |
| 5,969,426 A * | 10/1999 | Baba et al. | 257/778 |
| 6,008,543 A * | 12/1999 | Iwabuchi | 257/778 |
| 6,071,755 A | 6/2000 | Baba et al. | |
| 6,111,317 A * | 8/2000 | Okada et al. | 257/737 |
| 6,172,874 B1 | 1/2001 | Bartilson | |
| 6,177,725 B1 | 1/2001 | Yamada et al. | |
| 6,323,542 B1 | 11/2001 | Hashimoto | |
| 6,465,886 B1 | 10/2002 | Horiuchi et al. | |
| 6,479,322 B2 | 11/2002 | Kawata et al. | |
| 6,551,858 B2 | 4/2003 | Kawata et al. | |

FOREIGN PATENT DOCUMENTS

| | | |
|---|---|---|
| EP | 0 913 866 A1 | 5/1999 |
| FR | 2 725 305 | 4/1996 |
| JP | A-61-218145 | 9/1986 |
| JP | A-01-209746 | 8/1989 |
| JP | A-3-48435 | 3/1991 |
| JP | A-4-280458 | 10/1992 |
| JP | A-05-218042 | 8/1993 |
| JP | A-7-045665 | 2/1995 |
| JP | A-07-115096 | 5/1995 |
| JP | A 07-212045 | 8/1995 |
| JP | A-8-37190 | 2/1996 |
| JP | A-08-078484 | 3/1996 |
| JP | A-8-97217 | 4/1996 |
| JP | A-8-111473 | 4/1996 |
| JP | A-08-124930 | 5/1996 |
| JP | A-8-172112 | 7/1996 |
| JP | A 08-181423 | 7/1996 |
| JP | A-8-250498 | 9/1996 |
| JP | A-08-330313 | 12/1996 |
| JP | A-08-330355 | 12/1996 |
| JP | A-08-340002 | 12/1996 |
| JP | A-9-321168 | 12/1997 |
| JP | A-2005-191605 | 7/2005 |

* cited by examiner

ELECTRONIC COMPONENT, SEMICONDUCTOR DEVICE, METHODS OF MANUFACTURING THE SAME, CIRCUIT BOARD, AND ELECTRONIC INSTRUMENT

This is a Continuation of application Ser. No. 12/794,401 filed Jun. 4, 2010 (now U.S. Pat. No. 7,888,177), which is a Continuation of application Ser. No. 12/343,166 filed Dec. 23, 2008 (now U.S. Pat. No. 7,755,205), which is a continuation of application Ser. No. 11/976,835 filed Oct. 29, 2007 (now U.S. Pat. No. 7,485,973), which is a continuation of application Ser. No. 11/785,880 filed Apr. 20, 2007 (now U.S. Pat. No. 7,307,351), which is a continuation of application Ser. No. 10/331,510 filed Dec. 31, 2002 (now U.S. Pat. No. 7,235,881), which is a continuation of application Ser. No. 09/953,858 filed Sep. 18, 2001 (now U.S. Pat. No. 6,518,651), which is a continuation of application Ser. No. 09/142,856 filed Mar. 26, 1999 (now U.S. Pat. No. 6,323,542), which is a National Stage of PCT/JP98/00130 filed Jan. 16, 1998. The disclosures of the prior applications are hereby incorporated by reference herein in their entirety.

TECHNICAL FIELD

The present invention relates to a compact electronic component and a semiconductor device whose final formed package size is close to the size of the chip (semiconductor element), to methods of manufacturing these, to a circuit board on which these are mounted, and to an electronic instrument having this circuit board.

BACKGROUND ART

To pursue high density mounting in semiconductor devices, bare chip mounting is the ideal. However, quality control and handling of bare chips are difficult. For this reason, CSP (chip size/scale package) technology, in which the package size is close to the chip size, has been developed.

In such a CSP semiconductor device, an important problem is to relieve the thermal stress due to the differences in coefficient of thermal expansion between the semiconductor chip and the mounting board. In particular, as the number of pins continues to increase, it is essential that no wiring breaks are caused by thermal stress, since wiring is required to connect from the electrodes to the solder balls.

The present invention addresses the above described problems, and has as its object the provision of an electronic component, a semiconductor device, methods of manufacturing these, a circuit board on which these are mounted, and an electronic instrument having this circuit board.

DISCLOSURE OF THE INVENTION

The semiconductor device of the present invention comprises a semiconductor element, an external electrode provided within the region of the semiconductor element for external connection, wiring connected through a connection portion to the external electrode and electrically connecting the semiconductor element and the external electrode, a stress relieving portion provided on the semiconductor element, and a stress transmission portion transmitting stress from the external electrode to the stress relieving portion.

Since the semiconductor element and external electrode of the present invention are connected by the wiring, the pitch of external electrode can be converted as required. The stress transmission portion transmits stress from the external electrode to the stress relieving portion, and stress can be thus relieved.

The wiring is connected to the external electrode through a connection portion. The connection portion is not restricted to the case of existing as a separate member between the wiring and the external electrode, but includes the case of being a part of at least one of the wiring and external electrode. The connection portion is not restricted to directly contacting at least one of the wiring and external electrode, but includes the case of not directly contacting either. That is to say, the connection portion of the present invention indicates at least a part of the member electrically connecting the wiring and external electrode.

More specifically, the wiring may be provided on the stress relieving portion, and the stress transmission portion may be provided in the connection portion.

By this means, since the wiring is provided on the stress relieving portion, the connection portion and stress transmission portion are provided on the stress relieving portion, and the stress from the external electrode is transmitted to the stress relieving portion.

Alternatively, the wiring may be provided under the stress relieving portion, the connection portion may be provided to pass through the stress relieving portion, and the stress transmission portion may be formed on the stress relieving portion integrally with the connection portion.

By this means, since the connection portion passes through the stress relieving portion, the connection portion does not transmit stress vertically to the stress relieving portion. In place of this, the stress transmission portion provided on the stress relieving portion transmits stress to the stress relieving portion.

The stress relieving portion may be formed with a thickness to reach the stress transmission portion from the wiring.

The stress relieving portion may have a groove formed outside of the stress transmission portion. By forming a groove, the stress relieving portion is more easily deformed, and stress from the stress transmission portion can be absorbed more easily.

The stress relieving portion may have a space formed between a contact position on the wiring and a contact position under the stress transmission portion. By this means, the stress relieving portion is more easily able to deform, and stress from the stress transmission portion can be absorbed more easily.

A stress relieving portion having such a space may be formed with a thickness to reach the stress transmission portion from the wiring, and then may be etched from the outside of the stress transmission portion to underneath thereof.

The present invention may further comprise a supplementary transmission portion provided at least between a root periphery of the external electrode and the stress relieving portion, and transmitting stress from the external electrode to the stress relieving portion.

By means of the supplementary transmission portion, stress from the external electrode is transmitted to the stress relieving portion, and a concentration of stress between the external electrode and the stress transmission portion can be prevented.

The supplementary transmission portion may be formed of a material capable of being used for the stress relieving portion.

The stress relieving portion may include a first stress relieving layer and a second stress relieving layer formed on the first stress relieving layer;

the wiring may be provided between the first and second stress relieving layers;

the connection portion may be provided to penetrate the second stress relieving layer; and the stress transmission portion may be formed on the second stress relieving layer integrally with the connection portion.

By this means, the connection portion transmits stress in the vertical direction to the first stress relieving layer. Meanwhile, the stress transmission portion transmits stress to the second stress relieving layer. In this way, stress is relieved at two locations.

The stress relieving portion may include a first stress relieving layer and a second stress relieving layer formed on the first stress relieving layer;

the wiring may be provided between the first and second stress relieving layers;

the connection portion may be provided to penetrate the second stress relieving layer; and the stress transmission portion may include a first transmission portion formed between the first and second stress relieving layers integrally with the connection portion, and a second transmission portion formed on the second stress relieving layer integrally with the connection portion.

The connection portion transmits stress in the vertical direction to the first stress relieving layer. Stress is also transmitted to the first stress relieving layer from the first transmission portion of the stress transmission portion. Furthermore, the stress transmission portion has a second stress transmission portion, and this second stress transmission portion transmits stress to the second stress relieving layer. In this way, stress is relieved at three locations.

It is preferable that the second transmission portion has a larger area than the first transmission portion, and transmits the stress to the second stress relieving layer.

Since the second transmission portion transmits a large amount of stress, the stress transmitted by the first transmission portion is comparatively small. The first transmission portion is close to the direct contact portion of the connection portion and wiring. Therefore, by reducing the stress transmitted from the first transmission portion, the effect on this contact portion can be reduced.

It is preferable that the stress transmission portion is provided without contacting the connection portion.

By this means, the stress transmission portion does not transfer stress to the direct contact portion of the connection portion and wiring.

The stress relieving portion may have an isolation portion for inhibiting transmission of the stress between a support region supporting the stress transmission portion and a connection region in which the connection portion is formed.

Because the isolation portion is provided, stress transmitted from the stress transmission portion to the support region of the stress relieving portion is not transmitted to the connection region. Therefore, transfer of stress from the stress transmission portion through the stress relieving portion to the connection portion also does not occur.

Here, the isolation portion may for example be a groove.

The wiring preferably has a bent portion forming an empty portion with the semiconductor element.

By this means, since the wiring can freely deform in the bent portion, maximum stress absorption is possible.

A gel material may be injected in the empty portion to protect the bent portion.

The stress relieving portion may include a first stress relieving layer and a second stress relieving layer formed on the first stress relieving layer;

the wiring may include a first wiring portion formed below the first stress relieving layer and a second wiring portion formed between the first and second stress relieving layers;

the connection portion may include a first wiring connection portion penetrating the first stress relieving layer and connecting the first and second wiring portions and a second wiring connection portion penetrating the second stress relieving layer and connecting the external electrode and the second wiring portion;

the first and second wiring connection portions may be disposed on different planes; and the stress transmission portion may include a first transmission portion formed between the first and second stress relieving layers integrally with the first wiring connection portion, and a second transmission portion formed on the second stress relieving layer integrally with the second wiring connection portion.

Since the first and second wiring connection portions of the present invention are provided with first and second transmission portions respectively, in each of the wiring connection portions, stress can be transmitted to the stress relieving layer. The contact position of the first wiring connection portion with respect to the first and second wiring portions, and the contact position of the second wiring connection portion with respect to the external electrode and second wiring portion are disposed on different planes. Therefore, stress applied to one of the contact positions is not directly easily transferred to the other contact position. Since stress transferred from the external electrode is relieved before reaching the semiconductor element, the effect on this semiconductor element can be reduced.

The wiring may be brought out from the external electrode substantially at right angles to a direction of generation of the stress.

By this means, the generating direction of the stress and the extending direction of the wiring are substantially orthogonal. Thus the application of tension to the wiring in the direction of its extension and consequent wiring breaks can be prevented.

The stress transmission portion may be formed at a position outside of the connection portion.

Since the stress transmission portion is transmitting stress at a peripheral position of the connection portion of the external electrode and wiring, stress can be transmitted over a large area.

The electronic component of the present invention comprises an electronic element; an external electrode for external connection; wiring electrically connecting the electronic element and the external electrode; a stress relieving portion provided on the electronic element; and a stress transmission portion transmitting stress from the external electrode to the stress relieving portion, at a peripheral position of an electrical connection portion of the external electrode and the wiring.

The method of manufacturing an electronic component of the present invention comprises:

a step of integrally forming in substrate form a plurality of electronic element;

a step of forming an electrode on the electronic element in substrate form;

a step of providing a stress relieving portion on the electronic element in substrate form, avoiding the electrode;

a step of forming wiring from the electrode;

a step of providing a stress transmission portion transmitting stress from the external electrode to the stress relieving portion, in a peripheral position of the electrical connection portion of the wiring and external electrode; and a step of separating the electronic element in substrate form into individual elements.

The method of manufacturing a semiconductor device of the present invention comprises:

a step of forming an electrode on a wafer;

a step of providing a stress relieving portion on the wafer avoiding the electrode;

a step of forming wiring from the electrode;

a step of providing a stress transmission portion transmitting stress from the external electrode to the stress relieving portion, in a peripheral position of the electrical connection portion of the wiring and external electrode; and a step of separating the wafer into individual elements.

With an aspect of the present invention, after a stress relieving layer, wiring, and external electrode are formed on the wafer, the wafer is cut up to obtain individual semiconductor devices. Therefore, since the formation of stress relieving layer, wiring, and external electrode can be carried out simultaneously for a large number of semiconductor devices, the fabrication process can be simplified.

The step of forming a stress relieving portion may be carried out after the step of forming wiring; and a step of forming a groove by etching in the stress relieving portion outside of the stress transmission portion may be performed before the step of separating the wafer.

By forming the groove, the stress relieving portion is more easily deformed, and stress from the stress transmission portion can be absorbed more easily.

The step of forming the stress relieving portion may be carried out after the step of forming wiring; and a step of etching the stress relieving portion to under the stress transmission portion may be performed before the step of separating the wafer.

By this means, the stress relieving portion has a space formed between a contact position over the wiring and a contact position under the stress transmission portion. Thus, the stress relieving portion is more easily deformed, and stress from the stress transmission portion can be absorbed more easily.

A step of providing a material capable of being used for the stress relieving portion from over the stress relieving portion to at least a root periphery of the external electrode, to form a supplementary transmission portion, may be performed before the step of separating the wafer.

In this way, when the supplementary transmission portion is formed, stress from the external electrode is transmitted to the stress relieving portion by means of the supplementary transmission portion, and a concentration of stress between the external electrode and the stress transmission portion can be prevented.

The circuit board of present invention has the above described semiconductor device and a substrate on which a desired wiring pattern is formed; and external electrodes of the semiconductor device are connected to the wiring pattern. The electronic instrument of the present invention has this circuit board.

BEST MODE FOR CARRYING OUT THE INVENTION

Preferred embodiments of the present invention is now described with reference to the drawings. The present invention can be applied to a compact electronic component, in particular the examples described are of application to a semiconductor device.

Some of the drawings are enlarged for clarity. In particular the following explanation is in terms of a final separated individual semiconductor device, and therefore the terminology used, forms, and so forth, may be slightly different from in actual practice. Where a semiconductor chip is referred to, this may refer not only to a single separated device (that is, a chip) but also to devices in the form of a wafer. In other words, the term "semiconductor chip" used here refers to a certain circuit formed on a base substrate (for example of silicon) and capable of being used once separated, and is not restricted in respect of whether separated or whether still integral. Furthermore, references are restricted to typical locations where explanation is required such as wiring, and therefore in the figures where other locations are similar, or other constructions, are omitted.

First Embodiment

Figure 1:
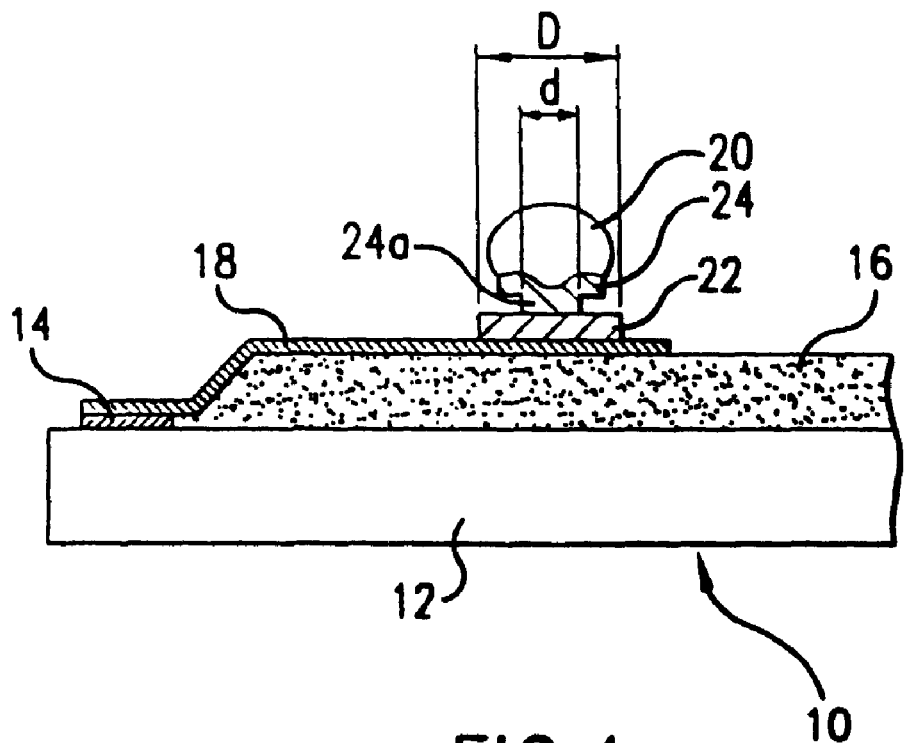
FIG. 1 shows a first embodiment of the semiconductor device.

FIG. 1 is a sectional view showing a first embodiment of the semiconductor device. A semiconductor device 10 shown in this figure comprises a stress relieving layer 16 and wiring 16 formed thereon. In more detail, on a semiconductor chip 12, a stress relieving layer 16 is formed to avoid an electrode 14, and wiring 18 is formed from the electrode 14 over the stress relieving layer 16.

The stress relieving layer 16 is formed from a photosensitive polyimide resin, and when the semiconductor device 10 is mounted on a substrate (not shown in the drawings), relieves the stress created by the difference in the coefficient of thermal expansion between the semiconductor chip 12 and the substrate. The polyimide resin is insulating with respect to the wiring 18, is able to protect the surface, and has heat resistance when a solder ball 20 is melted. A polyimide resin with a low Young's modulus (such as an olefin polyimide resin or BCB manufactured by the Dow Chemical Corporation) is preferably used, and in particular it is preferable that the Young's modulus be not more than about 20 kg/mm$^2$. The stress relieving layer 16 has a larger stress relieving effect the thicker it is, but a thickness approximately in the range 1 to 100 μm is preferable. However, when a polyimide resin with a Young's modulus of approximately 10 kg/mm$^2$ is used, a thickness of approximately 10 μm will be sufficient.

Alternatively, a material which has a low Young's modulus and is effective for stress relieving such as, silicone denatured polyimide resin, epoxy resin, or silicone denatured epoxy resin may be used as the stress relieving layer 16. When a nonphotosensitive resin is used, in combination with another resist, a required pattern may be formed by a photo-etching process.

The wiring 18 is formed of chromium (Cr). Here, chromium (Cr) is selected because of its good adhesion properties to the polyimide resin forming the stress relieving layer 16. Alternatively, when resistance to cracks is considered, ductile metal such as aluminum, aluminum alloys, such as aluminum-silicon and aluminum-copper, copper alloys, copper, or gold may be used. Besides, when titanium or titanium-tungsten, having excellent resistance to moisture is selected, wiring breaks due to corrosion can be prevented. Titanium is also preferable as it has favorable adhesion properties with respect to polyimide. When titanium is used for the wiring 18, a multi-layer construction of titanium and another of the above metals may be used. The wiring 18 is formed in a film by sputtering, plating, a combination thereof, or another method, and is patterned by photoetching.

It should be noted that the above described examples of materials for the stress relieving layer and wiring may equally be applied in a suitable way to all of the second and subsequent embodiments in the same way as to the first embodiment.

On the wiring 18, a solder ball (external electrode) 20 is provided. In more detail, a stress transmission portion 22 is provided on the wiring 18, a base 24 is provided on this stress transmission portion 22, and a solder ball 20 is provided on the seat 24. The stress transmission portion 22 and base 24 are formed by copper plating, and the solder ball 20 is formed of solder of at least a hemispherical ball shape. It should be noted that the stress transmission portion 22 and base 24 are preferably formed from the same metal as that used for the material of the wiring 18.

A characteristic of the present embodiment is that as shown in FIG. 1, the width d of the base portion 24a of the base 24 on the stress transmission portion 22 and the width D of the stress transmission portion 22 satisfy the relation d<D.

In other words, the base portion 24a of the base 24 forms a part (connection portion) of the element electrically connecting the solder ball (external electrode) 20 and the wiring 18, and the stress transmission portion 22 extends integrally to the peripheral position thereof. By forming such a stress transmission portion 22, the solder ball 20 is supported on the stress relieving layer 16 with a comparatively wide width D.

Such the wide stress transmission portion 22 is effective for transmitting stress. That is to say, for example, when heat is applied to the substrate and the semiconductor device mounted on the substrate because of the difference in the coefficient of thermal expansion between the mounting board and the semiconductor chip 12, a stress of bending the semiconductor chip 12 is created. This stress is a force bending over, with the center of the solder ball 20 as axis. According to the present embodiment, by means of the stress transmission portion 22 with the comparatively wide width D, the solder ball 20 is supported with respect to the stress relieving layer 16. Therefore, the stress tending to bend over the solder ball 20 is transmitted over a wide area to the stress relieving layer 16, and the stress can be largely absorbed by the stress relieving layer 16.

Besides, with regard to the stress transmission effect, the second and subsequent embodiments are also similar to that shown in the first embodiment.

It should be noted that while omitted from the drawings, to prevent corrosion and the like of the wiring a wiring protection layer such as solder resist is preferably provided as the outermost layer.

Second Embodiment

Figure 2:
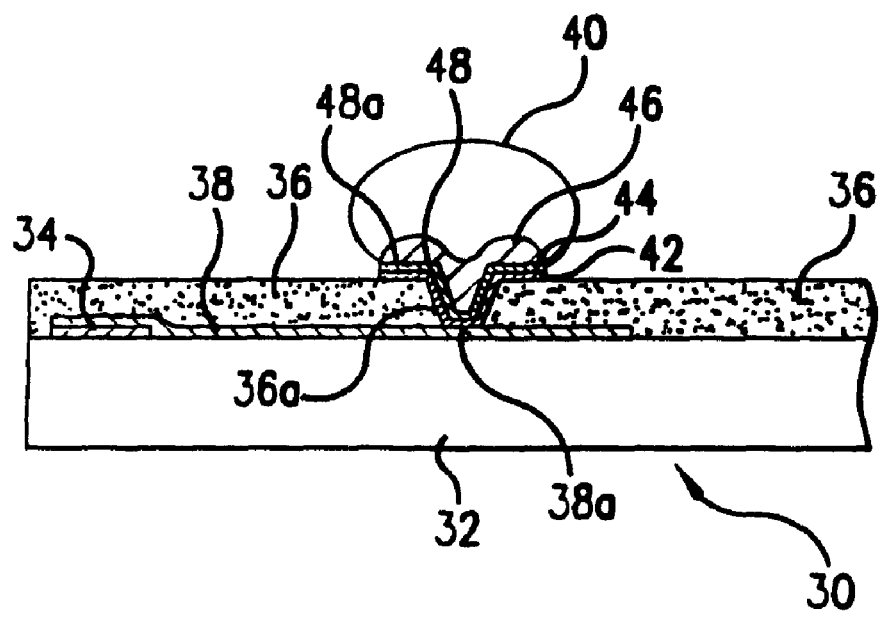
FIG. 2 shows a second embodiment of the semiconductor device.

FIG. 2 is a sectional view showing a second embodiment of the semiconductor device. The semiconductor device 30 shown in this figure has wiring 38 formed beneath a stress relieving layer 36. In more detail, on a semiconductor chip 32, with an oxide layer (not shown in the drawings) acting as an insulating layer interposed, wiring 38 is formed from an electrode 34. A stress relieving layer 36 is formed over this. It should be noted that the wiring 38 is formed of chromium (Cr).

In the stress relieving layer 36, a hole 36a is formed by photolithography, so that in the region of this hole 36a the wiring 38 is not covered by the stress relieving layer 36. In other words, the hole 36a is formed so that the wiring 38 is positioned directly under the hole 36a. Then a chromium (Cr) layer 42 and a copper (Cu) layer 44 are formed by sputtering applied to the wiring 38 and the inner circumferential surface and opening rim surface forming the hole 36a. In other words, the chromium (Cr) layer 42 and copper (Cu) layer 44 are farmed to pass through the stress relieving layer 36. Moreover, in the opening rim portion, the chromium (Cr) layer 42 and copper (Cu) layer 44 are arranged to extend with a comparatively wide width.

On the copper (Cu) layer 44, a base 46 is formed of copper (Cu), and on this base 46, a solder ball 40 is formed. The solder ball 40 is electrically connected to the electrode 34 through the drawn out wiring 38, the copper (Cu) layer 44, the chromium (Cr) layer 42 and the base 46.

According to the present embodiment, at the opening rim portion of the hole 36a, stress from the solder ball 40 is transmitted from a stress transmission portion 48 formed from at least a part of the chromium (Cr) layer 42, copper (Cu) layer 44 and base 46 to the stress relieving layer 36.

This stress transmission portion 48 is positioned outside a connection portion 38a. The connection portion 38a is a part of the chromium (Cr) layer 42, and is a part of the member electrically connecting the solder ball (external electrode) 40 and wiring 38.

In this example, the stress transmission portion 48 is provided to include a flange portion 48a, in other words, a projecting portion. Therefore, the stress acting to bend over with the center of the solder ball 40 as axis can be transmitted over a wide area to the stress relieving layer 36 by the stress transmission portion 48. The larger the area of the stress transmission portion 48, the more effective it is.

Besides, according to the present embodiment, since the stress transmission portion 48 is disposed at a different height from the connection portion 38a with respect to the wiring 38, and the connection portion 38a and wiring 38 are disposed on a hard oxide layer, the stress generated is absorbed by the stress relieving layer 36. Therefore, stress is less likely to be transmitted to the connection portion 38a, and to the wiring 38, and as a result cracks can be prevented.

Third Embodiment

Figure 3:
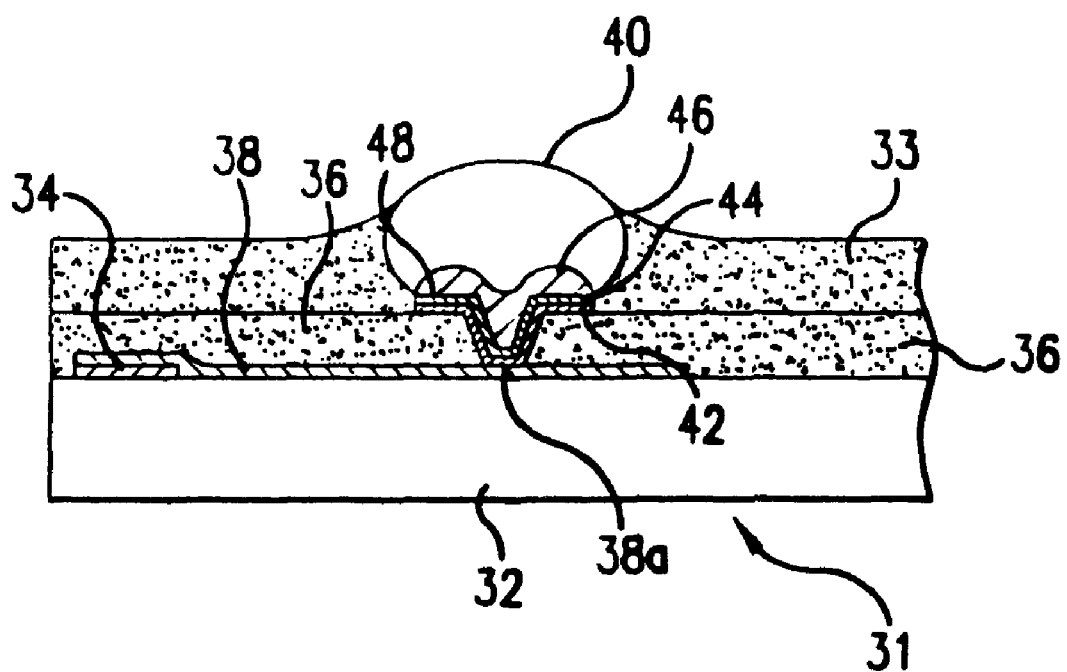
FIG. 3 shows a third embodiment of the semiconductor device.

FIG. 3 is a sectional view showing a third embodiment of the semiconductor device. The semiconductor device 31 shown in this figure has a supplementary transmission layer 33 formed on the stress relieving layer 36 of the semiconductor device shown in FIG. 2. In the present embodiment also, the connection portion 38a is a part of the chromium (Cr) layer 42, and is a part of the member electrically connecting the solder ball (external electrode) 40 and wiring 38.

The supplementary transmission layer 33 is formed in contact with, at least, the root periphery of the solder ball 40. Therefore, through the supplementary transmission layer 33, stress is transmitted from the solder ball 40 to the stress relieving layer 36. By this means, the stress is dispersed, and between the solder ball 40 and the stress transmission portion 48, in particular at the connecting portion of the base 46 with the copper (Cu) layer 44, a concentration of stress is avoided. It should be noted that here, the stress transmission portion 48 is formed from at least a part of the chromium (Cr) layer 42, copper (Cu) layer 44 and base 46.

The supplementary transmission layer 33 is constructed of a resin capable of being used for the stress relieving layer 36, and its thickness is determined by the flexibility (Young's modulus) of the resin itself, and the magnitude of the stress which it is required to be transmitted. More specifically, when a soft resin is used, a large stress transmission is possible by forming the supplementary transmission layer 33 with greater thickness. Besides, when a comparatively hard resin is used, by forming the supplementary transmission layer 33 to be thin, excessive stress transmission can be avoided.

The supplementary transmission layer 33 can be formed by spin coating after formation of the solder ball 40.

Alternatively, after formation of the stress transmission portion 48 (including the base 46), and before forming the solder ball 40, a resin layer may be formed on the stress relieving layer 36, an opening formed in the resin layer on the stress transmission portion 48, and the solder ball 40 provided. In this case, the opening can be formed by the application of a photolithography technique, or an etching technique (dry or wet).

These methods are suitable when the supplementary transmission layer 33 is formed before cutting the semiconductor device into individual pieces.

Fourth Embodiment

Figure 4A:
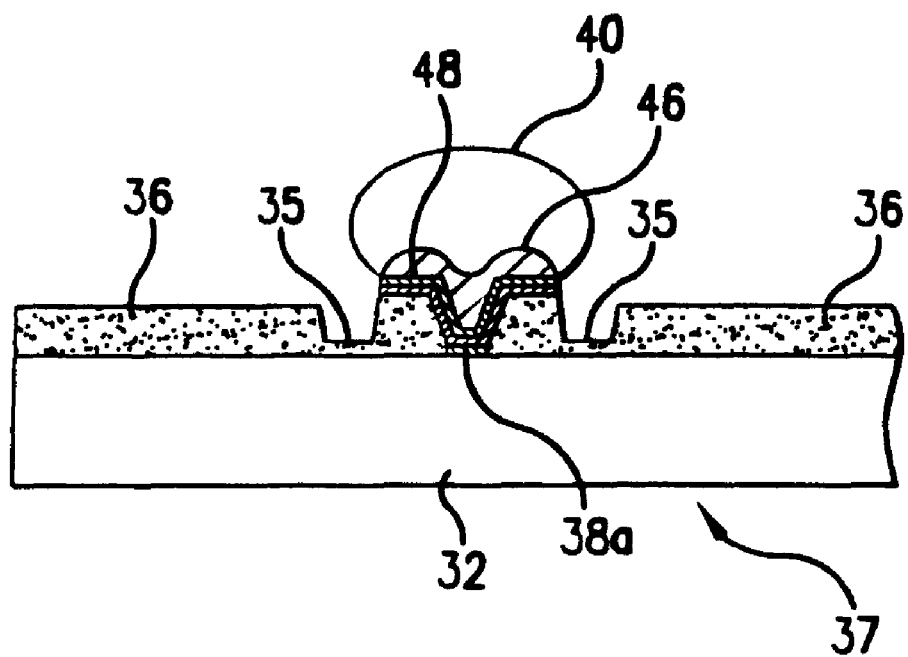
FIGS. 4A and 4B shows a fourth embodiment of the semiconductor device.
Figure 4B:
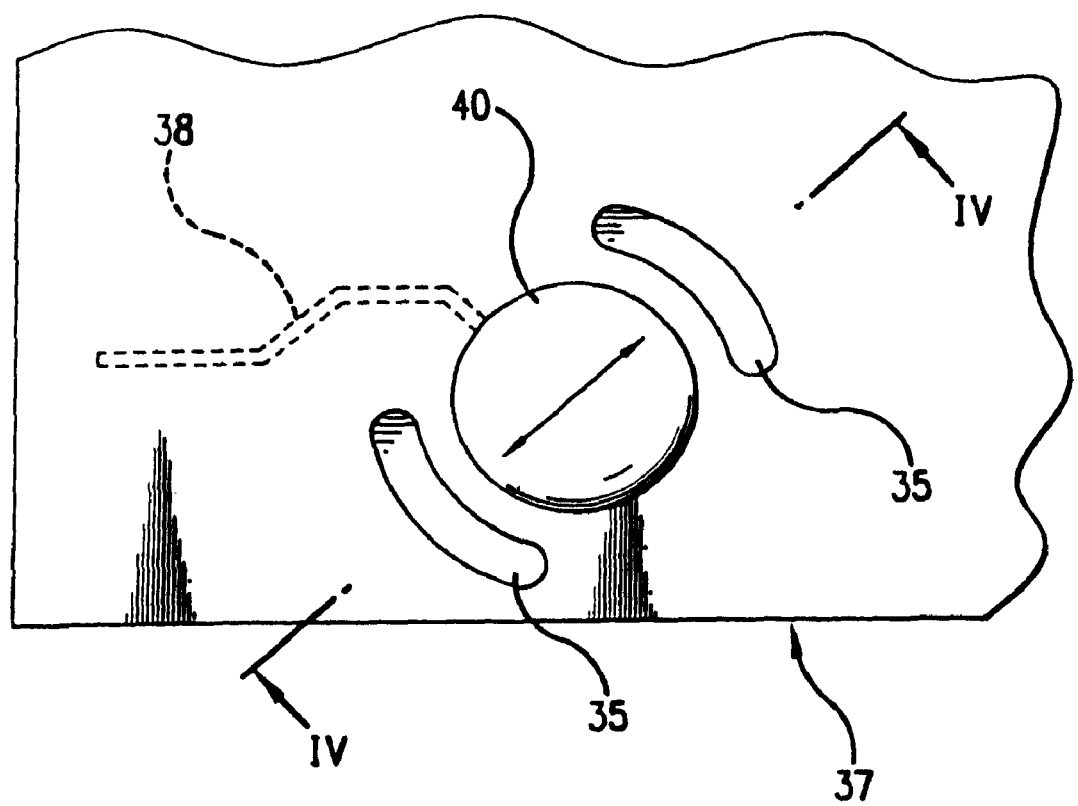

FIGS. 4A and 4B are sectional views showing a fourth embodiment of the semiconductor device. It should be noted that FIG. 4A is a section along the line IV-IV in FIG. 4B. The semiconductor device 37 shown in these figures has grooves 35 formed in the stress relieving layer 36 of the semiconductor device 30 shown in FIG. 2. However, FIGS. 2 and 4A differ in the section position. In the present embodiment again, the connection portion 38a is a part of the member electrically connecting the solder ball (external electrode) 40 and wiring 38 (see FIG. 2).

As shown in FIGS. 4A and 4B, the grooves 35 are formed positioned on the outside of the stress transmission portion 48 in the stress relieving layer 36.

By this means, when stress is transmitted from the stress transmission portion 48 to the stress relieving layer 36, the stress relieving layer 36 can more easily deform at a portion closer to the stress transmission portion 48 than the grooves 35. By means of this, the stress relieving layer 36 can more easily absorb stress. In particular, by forming the grooves 35 when the material forming the stress absorption layer 36 has a low degree of flexibility (high Young's modulus), a stress relieving ability equal to that of the case of a material of a high degree of flexibility (low Young's modulus) can be obtained. If a material of a high degree of flexibility is used, and then the above described forming is carried out, stress relief can be even more so achieved. The same effect can be expected in the fifth and sixth embodiments described below.

Besides, the grooves 35 are formed on the sides in the direction (shown by an arrow in FIG. 4B) in which stress is applied from the stress transmission portion 48 to the stress relieving layer 36. Therefore, in the direction in which the stress is applied, the stress relieving ability is increased.

It should be noted that the position of formation of the grooves 33 is not restricted to the positions shown in FIGS. 4A and 4B. For example, the grooves 35 may be formed on sides in a direction other than the direction (shown by an arrow in FIG. 4B) in which stress is applied from the stress transmission portion 48 to the stress relieving layer 36, or may be formed to surround the stress transmission portion 48.

Fifth Embodiment

Figure 5:
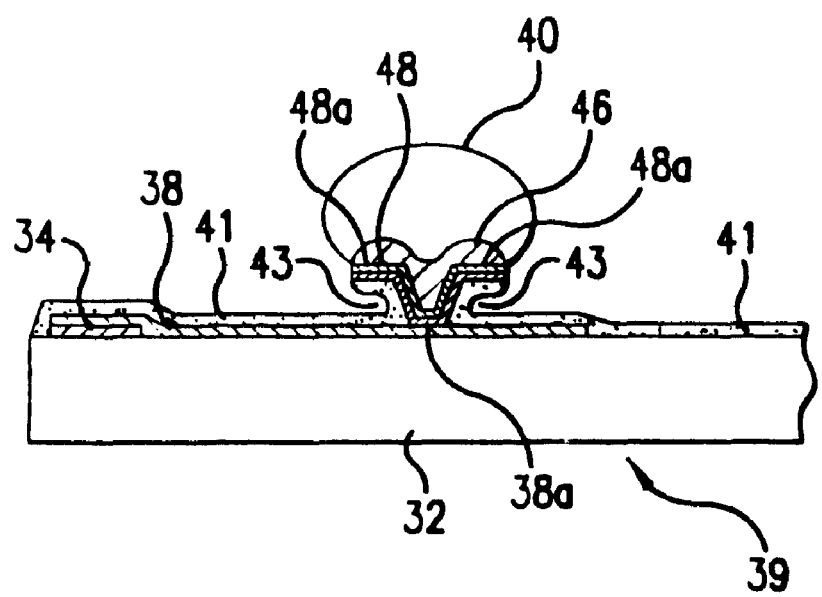
FIG. 5 shows a fifth embodiment of the semiconductor device.

FIG. 5 is a sectional view showing a fifth embodiment of the semiconductor device. The semiconductor device 39 shown in this figure is one in which the stress relieving layer 36 of the semiconductor device 30 shown in FIG. 2 is etched.

That is to say, the stress relieving layer 41 of the semiconductor device 39 is formed to be thinner than the stress relieving layer 36 shown in FIG. 2. A space 43 is formed between the contact position below the flange 48a of the stress transmission portion 48 and the contact position on the wiring 38. In other words, below the flange portion 48a of the stress transmission portion 48, the stress relieving layer forms a neck. This neck portion may have a circular cross-section, or may equally be formed with a taper.

In the present embodiment too, the connection portion 38a is part of the member electrically connecting the solder ball (external electrode) 40 and wiring 38.

In this way, by forming the space 43 below the flange portion 48a of the stress transmission portion 48, the stress relieving layer 41 is more easily able to deform. By means of this the stress relieving layer 41 is more easily able to absorb stress.

The space 43, can be formed by carrying out isotropic dry etching on the stress relieving layer 36 shown in FIG. 2. More specifically, by isotropic dry etching, the etch rate is approximately equal in the horizontal direction and the depth direction. As a result, as shown in FIG. 5, it is possible to etch into a necked shape below the flange portion 48a of the stress transmission portion 48. By means of this, the space 43 can be formed.

Sixth Embodiment

Figure 6:
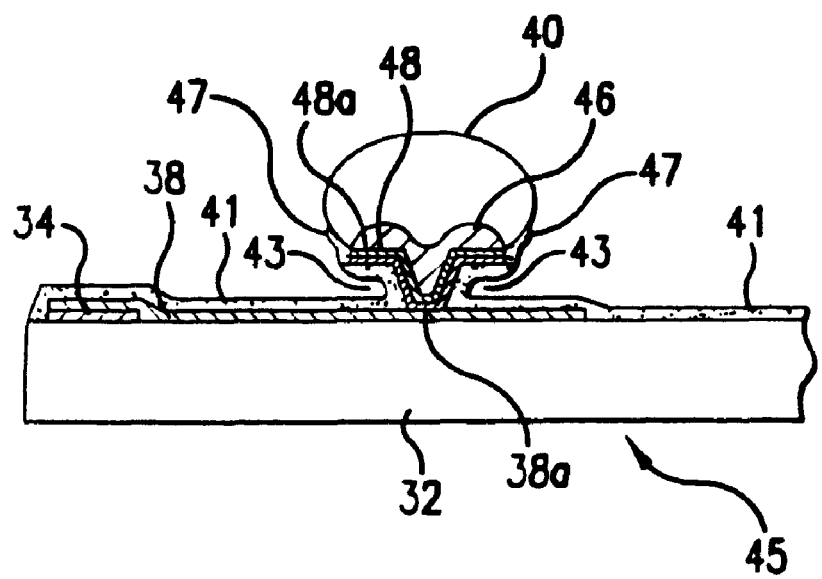
FIG. 6 shows a sixth embodiment of the semiconductor device.

FIG. 6 is a sectional view showing a sixth embodiment of the semiconductor device. The semiconductor device 45 shown in this figure has a supplementary transmission portion 47 added to the semiconductor device 38 shown in FIG. 5.

That is to say, in FIG. 6, a supplementary transmission portion 47 is formed continuous with the stress relieving layer 41 on the periphery of the solder ball 40. The supplementary transmission portion 47 is interposed at least between the root periphery of the solder ball 40 and the stress relieving layer 41. By this means, stress applied to the solder ball 40 can be transmitted through the supplementary transmission portion 47 to the stress relieving layer 41. Moreover, the stress is dispersed, and concentration of the stress at the connecting area of the solder ball 40 and stress transmission portion 48 is avoided.

The semiconductor device 45 having a supplementary transmission portion 47 of this type can be fabricated by, forming the stress relieving layer 36 and supplementary transmission layer 33, as shown in FIG. 3, and then carrying out etching in the same way as in the fifth embodiment.

In the present embodiment too, the connection portion 38a is part of the member electrically connecting the solder ball (external electrode) 40 and wiring 38.

Seventh Embodiment

Figure 7:
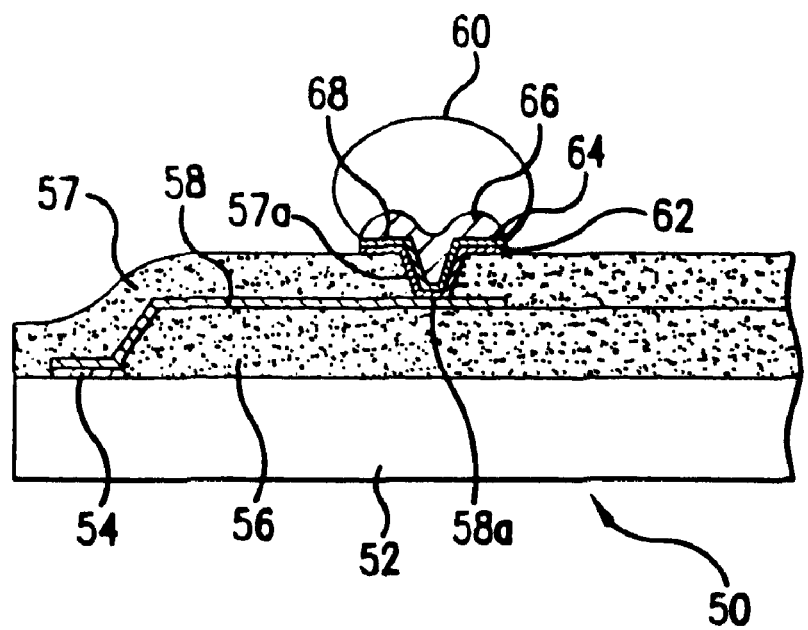
FIG. 7 shows a seventh embodiment of the semiconductor device.

FIG. 7 is a sectional view showing a seventh embodiment of the semiconductor device. This seventh embodiment has the characteristics of both the first and second embodiments.

In this figure, a semiconductor device 50 has wiring 58 formed between first and second stress relieving layers 56 and 57. In more detail, on a semiconductor chip 52, a first stress relieving layer 56 is formed to avoid an electrode 54, and wiring 58 is formed from the electrode 54 over the stress relieving layer 56. This structure is the same as in the first embodiment.

Over the wiring 58, a second stress relieving layer 57 is formed. The second stress relieving layer 57 may also be provided with a thickness in a range similar to that of the above described first stress relieving layer 56. In this stress relieving layer 57, a hole 57a is formed. A chromium (Cr) layer 62 and a copper (Cu) layer 64 are formed to pass through the stress relieving layer 57. Alternatively, in place of these, the wiring 18 described in the first embodiment may be used. At opening rim portion of the hole 57a, and the chromium (Cr) layer 62 and copper (Cu) layer 64 are arranged to broaden with comparatively wide range. On the copper (Cu) layer 64 a base 66 is formed, and a solder ball 60 is formed on this base 66.

In the opening rim portion of the hole 57a, stress from the solder ball 60 is transmitted from a stress transmission portion 68 formed by the chromium (Cr) layer 62, copper (Cu) layer 64, and a part of base 66, to the second stress relieving layer 57. The stress transmission portion 66 is provided outside the connection portion 58a. Here, the connection portion 58a is part of the chromium (Cr) layer 62, and is part of the member electrically connecting the solder ball (external electrode) 80 and wiring 58.

The structure, above the wiring 58 is the same as in the second embodiment, and detailed description is omitted.

According to the present embodiment, stress in the vertical direction from the solder ball 60 is transmitted through the connection portion 58a to the first stress relieving layer 56 and absorbed, while being transmitted through the stress transmission portion 68 to the second stress relieving layer 57 and absorbed. In this way, a two-stage absorbing structure is provided, whereby the stress absorption is even more effective. It should be noted that in the present embodiment, the second stress relieving layer 57 also serves as a protecting layer for the wiring 58 and semiconductor chip 52.

It should be noted that the second stress relieving layer 57 of the present embodiment may also have the grooves 35, the necked form of the stress relieving layer 41, or the supplementary transmission portion 47 of the fourth to sixth embodiments.

Eighth Embodiment

Figure 8:
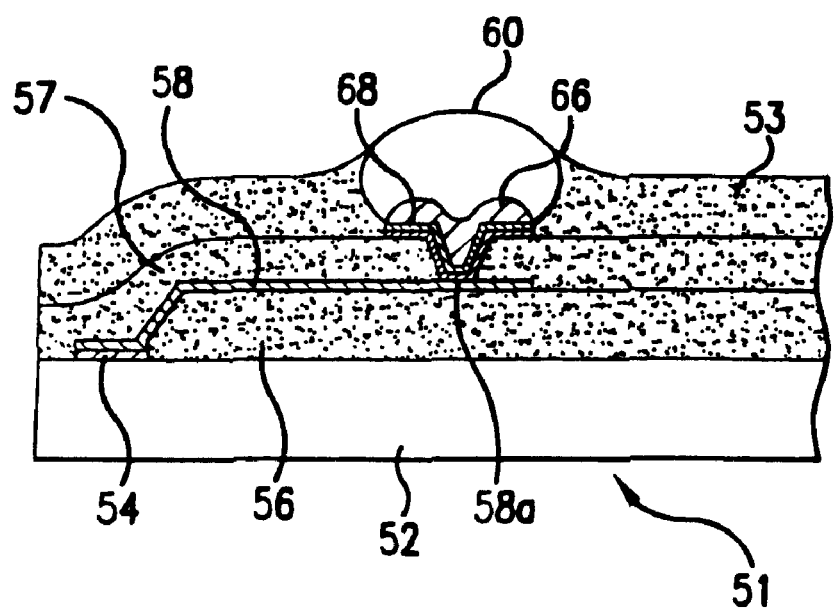
FIG. 8 shows an eighth embodiment of the semiconductor device.

FIG. 8 is a sectional view showing an eighth embodiment of the semiconductor device. The semiconductor device 51 shown in this figure has a supplementary transmission layer 53 formed on the first stress relieving layer 57 of the semiconductor device 50 shown in FIG. 7. In the present embodiment too, the connection portion 58a is part of the member electrically connecting the solder ball (external electrode) 60 and the wiring 58.

The supplementary transmission layer 53 is formed at least contacting the root periphery of the solder ball 60. Therefore, through the supplementary transmission layer 53, stress is transmitted from the solder ball 60 to the stress relieving layer 57. By this means, stress is dispersed, and a concentration of stress at the connecting portion of the solder ball 60 and the stress transmission portion 68 is avoided.

It should be noted that the material and method of formation of the supplementary transmission layer 53 is the same as in the third embodiment, and description is omitted.

Ninth Embodiment

Figure 9:
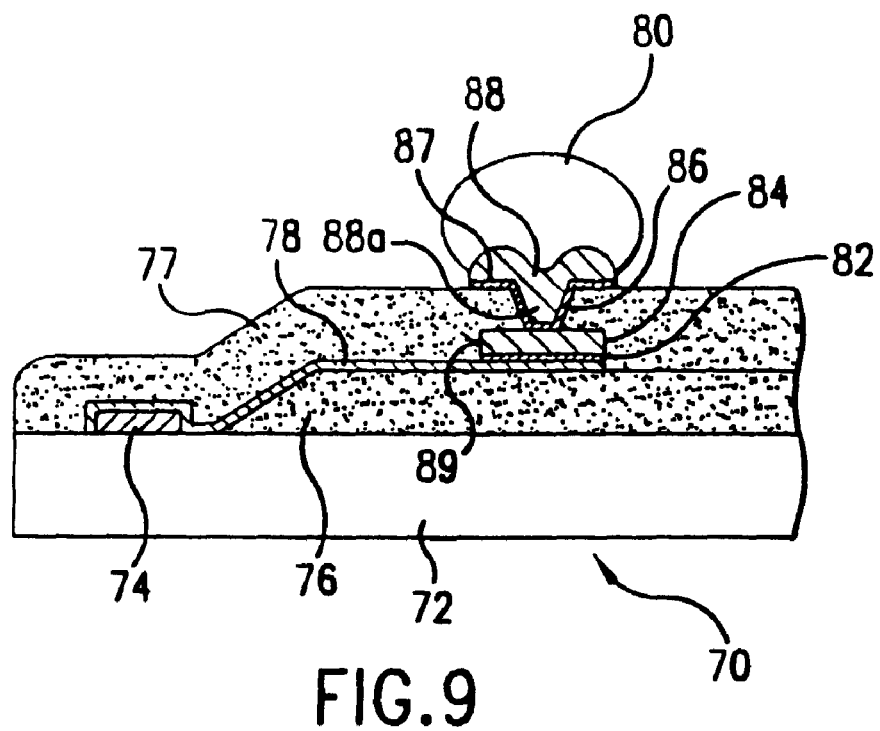
FIG. 9 shows a ninth embodiment of the semiconductor device.

FIG. 9 is a sectional view showing a ninth embodiment of the semiconductor device. The ninth embodiment is a modification of the seventh embodiment.

In this figure, a semiconductor device 70 has wiring 78 formed between first and second stress relieving layers 76 and 77. In more detail, a first stress relieving layer 76 is formed on the semiconductor chip 72, avoiding an electrode 74. Wiring 78 is formed from the electrode 74 over the stress relieving layer 76.

On the wiring 78, a second stress relieving layer 77 is formed. To pass through this stress relieving layer 77, a copper (Cu) layer 82 is formed by sputtering, a copper (Cu) layer 84 is formed by plating, a copper (Cu) layer 88 is formed by sputtering, and a base 88 is formed by plating. A solder ball 80 is formed on this base 88.

Here, the copper (Cu) layer 82 and copper (Cu) layer 84 have a larger area than the base 88 and base portion 88a of the copper (Cu) layer 80. In the copper (Cu) layer 82 and copper (Cu) layer 84, a stress transmission portion 89 corresponding to the position of the periphery of the base portion 88a transmits stress from the solder ball 80 to the first stress relieving layer 76. It should be noted that a portion of the stress transmission portion 89 (the portion contacting the base portion 88a) forms a part (connection portion) of the member electrically connecting the solder ball (external electrode) 80 and wiring 78.

According to the present embodiment, since the stress transmission portion 89 is formed positioned on the periphery of the base portion 88a electrically connecting the solder ball 80 and wiring 78, stress can be transmitted to the first stress relieving layer 76 over a large area. It should be noted that in the present embodiment, even if the first stress relieving layer 76 is omitted, the stress can be absorbed by the second stress relieving layer 77.

In the present embodiment too, a stress transmission portion 87 similar to the stress transmission portion 68 of the seventh embodiment (see FIG. 7) may be further formed, and a similar effect will be obtained.

Tenth Embodiment

Figure 10:
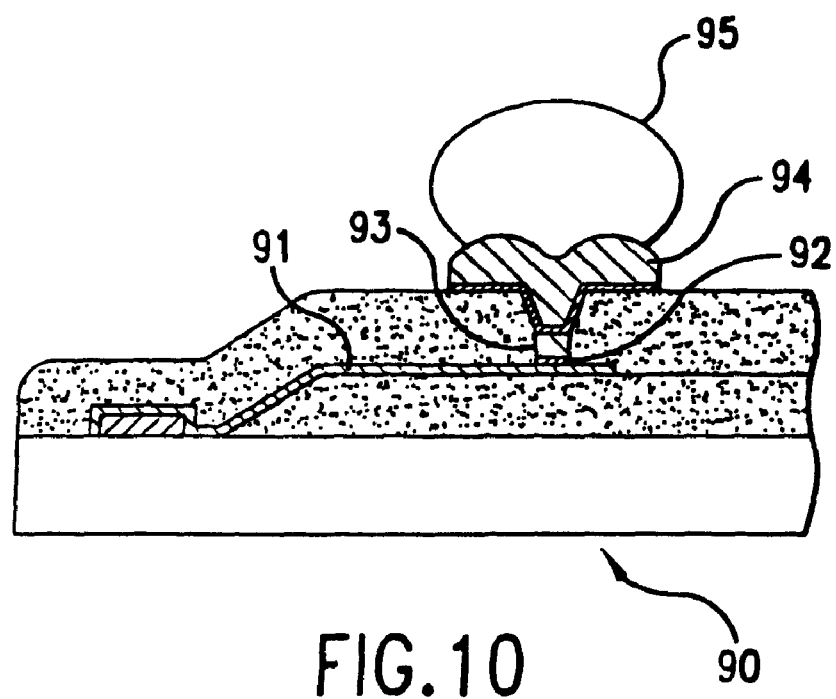
FIG. 10 shows a tenth embodiment of the semiconductor device.

FIG. 10 is a sectional view showing a tenth embodiment of the semiconductor device. This tenth embodiment is a modification of the ninth embodiment. Here, to describe only difference from the ninth embodiment. A copper (Cu) layer 92 and copper (Cu) layer 93 formed on wiring 91 are smaller than a stress transmission portion 94. Therefore, stress tending to bend over a solder ball 95 is transmitted from the stress transmission portion 94, but hard to be transmitted from the copper (Cu) layer 92 and copper (Cu) layer 93. Moreover, the copper (Cu) layer 92 and copper (Cu) layer 93 do not function as a stress transmission portion, and therefore stress tends not to be transmitted to wiring 91. By this means, breaks of the wiring 91 can be prevented.

In the present embodiment, a part of the stress transmission portion 94 forms a part (connection portion) of the member electrically connecting the solder ball (external electrode) 95 and wiring 91.

It should be noted that the effect in the ninth embodiment that even if the first stress relieving layer 76 is omitted, the stress can be absorbed by the second stress relieving layer 77 is the same in the tenth embodiment.

Eleventh Embodiment

Figure 11A:
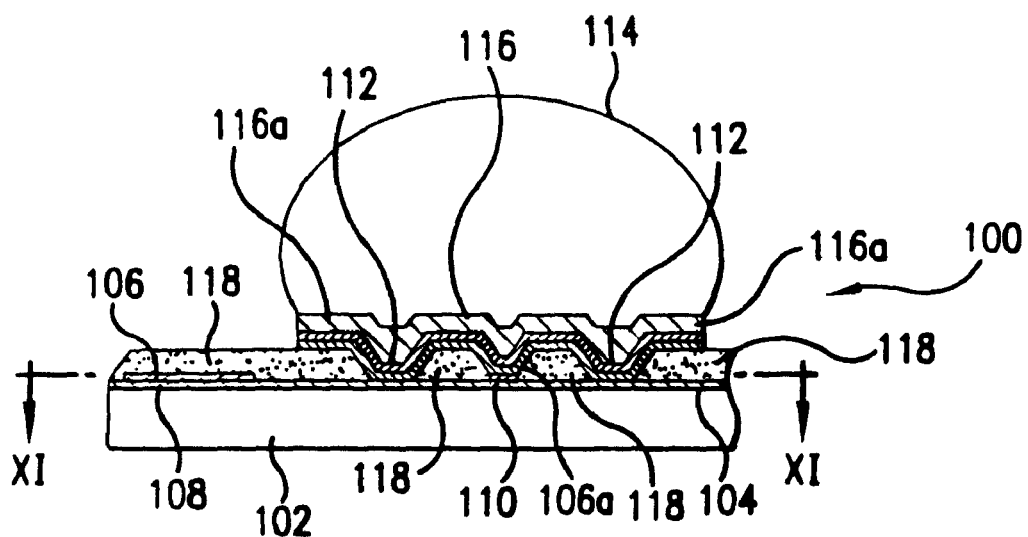
FIGS. 11A and 11B show an eleventh embodiment of the semiconductor device.
Figure 11B:
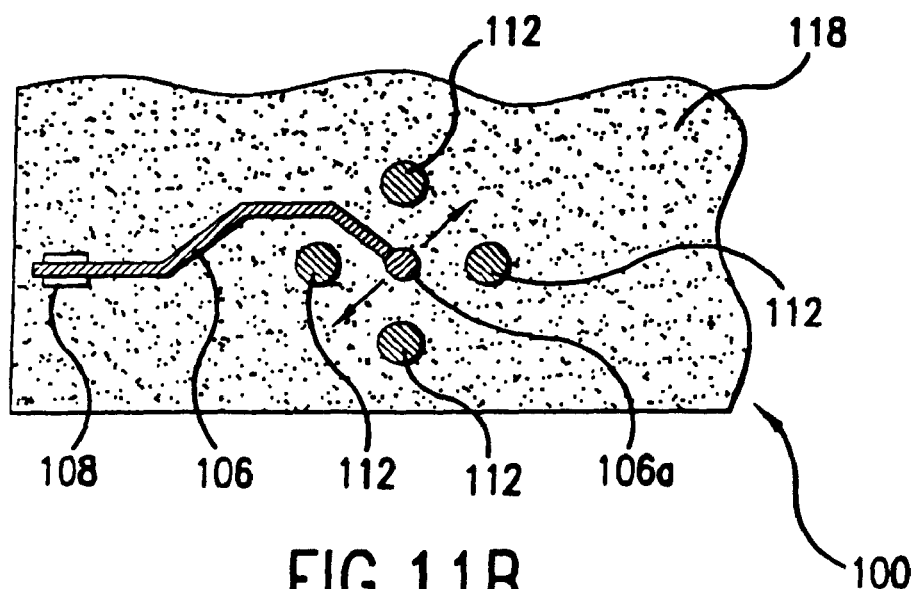

FIGS. 11A and 115 show an eleventh embodiment of the semiconductor device. It should be noted that FIG. 11B is a plan view seen along line XI-XI in FIG. 11A.

As shown in these figures, with a semiconductor device 100, a solder ball 114 is supported by a stress transmission portion 112 in a position not contacting an electrical connection portion 110.

In more detail, on an oxide layer 104 formed on a semiconductor chip 102, wiring 106 is formed. The wiring 106 electrically connects a pad 106a positioned in the center of the solder ball with to an electrode 108. Moreover, the wiring 106 extends from the pad 106a in a direction perpendicular to the direction (shown by an arrow in FIG. 11B) of stress generated by differences in the coefficient of thermal expansion between the mounting board and the semiconductor device 100. Therefore, even if stress is applied to the wiring 108, since force is not applied in the direction of extension in the vicinity of the pad 106a, wiring breaks are less likely to occur.

On the wiring 106 a stress relieving layer 118 is formed. However, on the pad 106a a hole is formed in the stress relieving layer 118, and the connection portion 110 is formed to electrically connect the pad 106a and solder ball 114. The connection portion 110 forms a part of the member electrically connecting the solder ball (external electrode) 114 and wiring 106.

Besides, in a peripheral position of the connection portion 110 and in a noncontact position, between an oxide layer 104 and solder ball 114 a plurality of stress transmission portions 112 are provided. For this reason, in the stress relieving layer 118 a plurality of holes are formed. It should be noted that the connection portion 110 and stress transmission portion 112 are formed continuously as projections projecting downward from a base 116 which supports the solder ball 114.

The present embodiment has the above described structure, and its effect is now described. In the present embodiment, the solder ball 114 is electrically connected to the wiring 106 by the connection portion 110 in a central position thereof. Then a stress transmission portion 112 is provided in a peripheral position of the connection portion 110 and in a noncontact position. Therefore, since it is in the noncontact state, the influence of the stress transmitted by the stress transmission portion 112 tends not to be transmitted to the connection portion 110. Thus, stress is not transmitted to the wiring 106 and wiring breaks can be prevented.

The base 116 partially contacts above the stress relieving layer 118. In particular, a contact portion 116a positioned on the periphery of the stress transmission portion 110 is such as to transmit stress to the stress relieving layer 118 and absorb the same.

Twelfth Embodiment

Figure 12A:
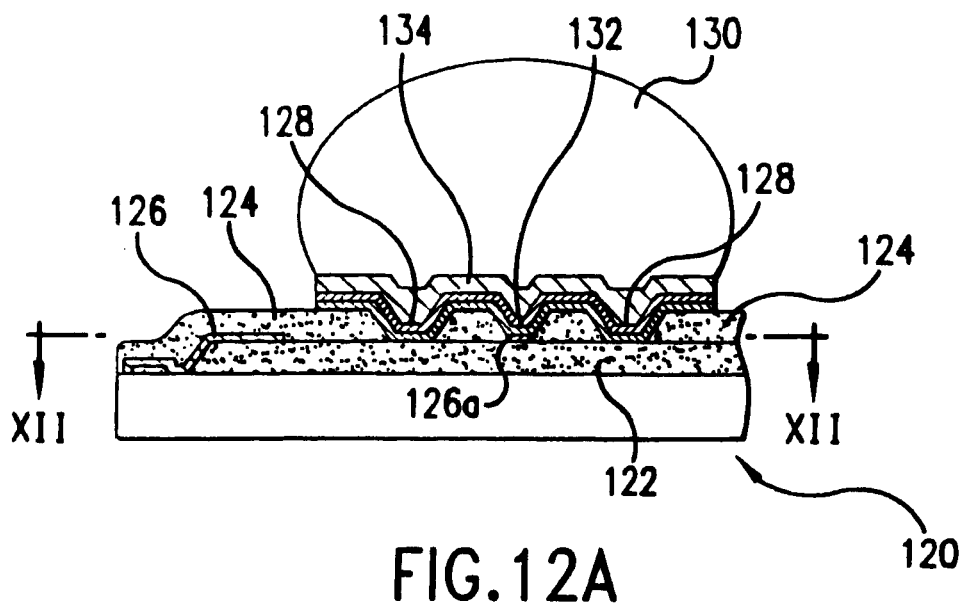
FIGS. 12A and 12B show a twelfth embodiment of the semiconductor device.
Figure 12B:
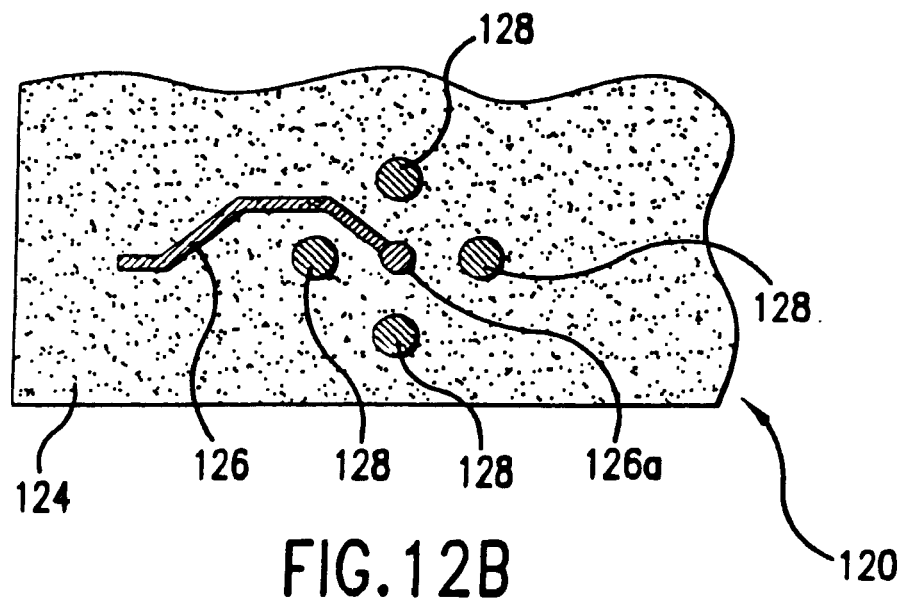

FIGS. 12A and 12B show a twelfth embodiment of the semiconductor device. It should be noted that FIG. 129 is a plan view seen along line XII-XII in FIG. 12A. This twelfth embodiment is a modification of the above described eleventh embodiment. Here the differences from the eleventh embodiment are described.

In FIGS. 12A and 12B, a semiconductor device 120 has first and second stress relieving layers 122 and 124. Then wiring 126 is formed on the first stress relieving layer 122, and a stress transmission portion 128 is formed on the first stress relieving layer 124. Therefore, stress from a solder ball 130 is transmitted from the stress transmission portion 128 to the first stress relieving layer 122, and absorbed. It should be noted that with regard to a connection portion 132 formed on a pad 126a, the structure is the same as the connection portion 110 shown in FIG. 11A, and therefore description is omitted. That is to say, the connection portion 132 forms a part of the element electrically connecting the solder ball (external electrode) 130 and wiring 126.

According to the present embodiment, stress is relieved through the stress transmission portion 128 by the first stress relieving layer 122. Therefore, the base 134 has a flange formed in a peripheral position of the stress transmission portion 128. The contact portion with the second stress relieving layer 124 is omitted. However, a contact portion may be provided in the same way as in the eleventh embodiment.

Thirteenth Embodiment

Figure 13:
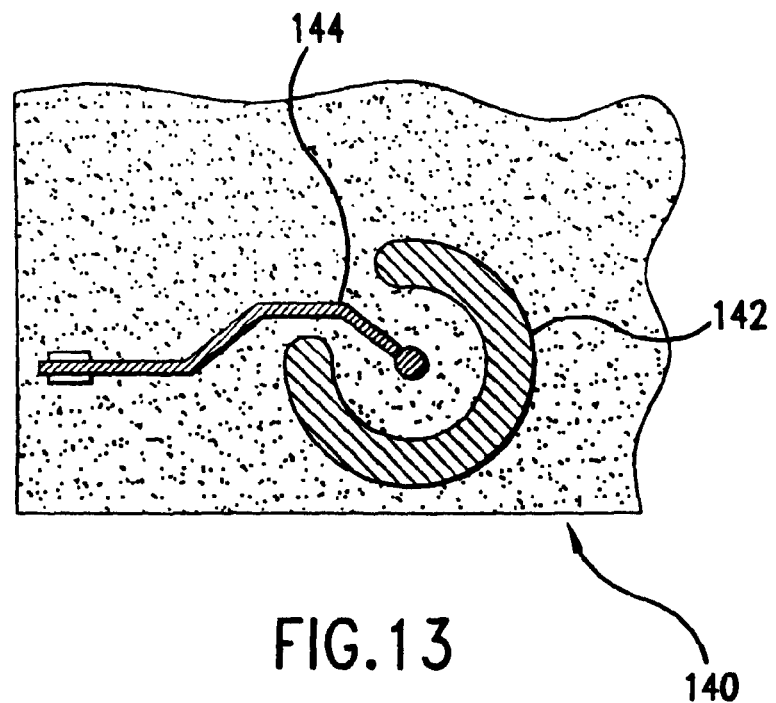
FIG. 13 shows a thirteenth embodiment of the semiconductor device.

FIG. 13 shows a thirteenth embodiment of the semiconductor device. This thirteenth embodiment is a modification of the above described eleventh and twelfth embodiments. In other words, in place of the plurality of pillar-shaped stress transmission portions 112 shown in FIGS. 11A and 11B, the semiconductor device 140 shown in FIG. 13 has a cylindrical stress transmission portion 142. This stress transmission portion 142 has a part cut away to allow wiring 144 to be led to the inside, and is arranged not to contact the wiring 144. Even with a stress transmission portion 142 of this type, the same effect as in the eleventh embodiment can be achieved.

The connection portion electrically connecting the solder ball (external electrode) and wiring is the same as in the twelfth embodiment.

Fourteenth Embodiment

Figure 14:
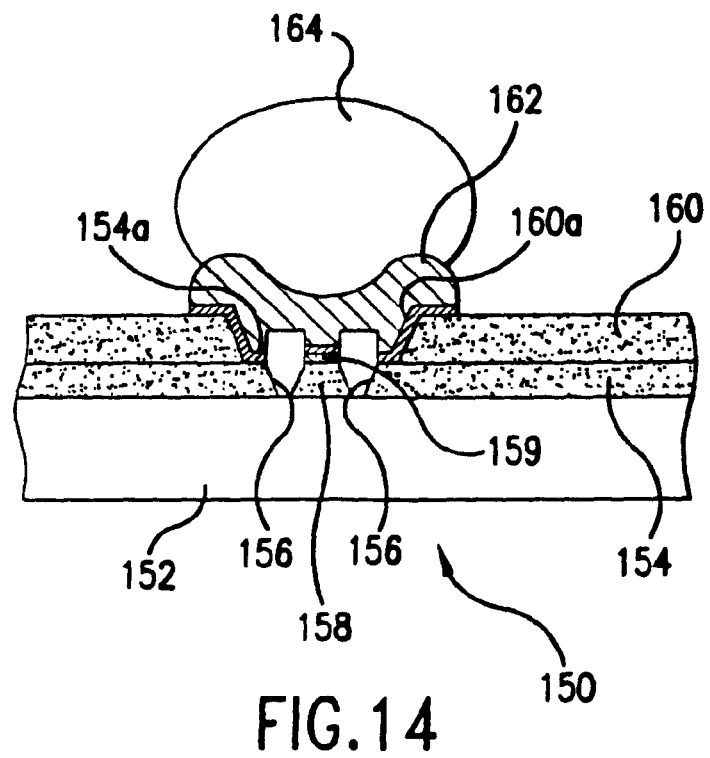
FIG. 14 shows a fourteenth embodiment of the semiconductor device.

FIG. 14 shows a fourteenth embodiment of the semiconductor device. The semiconductor device 150 shown in this figure also has a first stress relieving layer 154 formed on a semiconductor chip 152. However, in this stress relieving layer 154 a substantially circular groove 156 is formed. Thus an island portion 158 delineated by the groove 156 is formed.

Besides, wiring 159 is formed to reach the island portion 158. In more detail, in order to form the wiring 159, the groove 156 is formed in a C-shape.

On the first stress relieving layer 154, a second stress relieving layer 160 is formed. In the second stress relieving layer 160, a hole 160a is formed to extend further outside than the groove 156.

Then on the inner surface and opening rim portion of the hole 160a, on the surface 154a of the first stress relieving layer 154 exposed by the hole 160a, and on the wiring 159 formed on the island portion 158, a base 162 is provided with a thin metal film interposed by sputtering. A solder ball 164 is provided on the base 162.

According to the present embodiment, island portion 158 is isolated from the region receiving stress from the solder ball 164, by means of the groove 156. Therefore, stress tends not to be transmitted to the wiring 159, and the occurrence of wiring breaks can be prevented.

It should be noted that the connection portion being one part of the member electrically connecting the solder ball (external electrode) and wiring is the same as in the twelfth embodiment.

Fifteenth Embodiment

Figure 15:
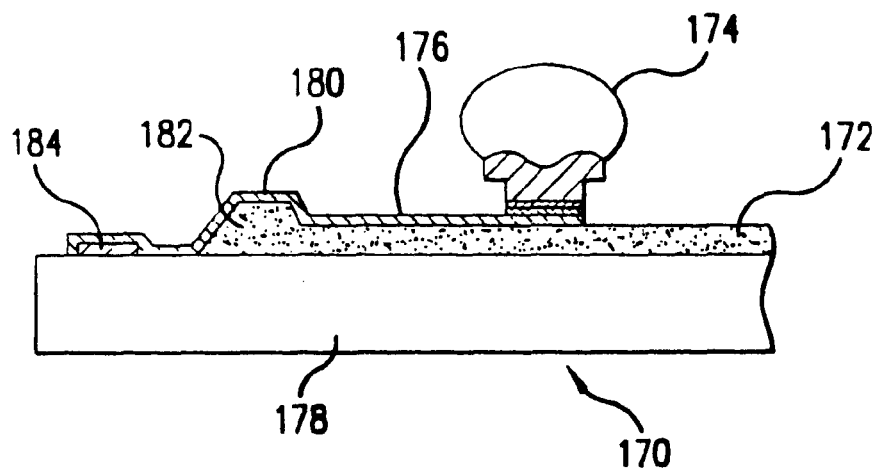
FIG. 15 shows a fifteenth embodiment of the semiconductor device.

FIG. 15 shows a fifteenth embodiment of the semiconductor device. The semiconductor device 170 shown in this figure has a bump 174 provided on a stress relieving layer 172 to absorb stress. It is the same as the above embodiments from the point of view of stress absorption.

The characteristic of the present embodiment is that wiring 176 has a bent portion 180 forming an empty portion between the wiring 176 and the semiconductor chip 178, and the empty portion is injected with a gel material 182. It should be noted that since the gel material 182 is inserted for the purpose of reinforcement, it may be omitted. Besides, the wiring 176 is preferably formed of metal from the viewpoint of ductility. In this way, when the bent portion 180 is formed, even if stress is applied to the wiring 176, it is absorbed by the bent portion 180. Therefore, stress transmitted from the bump 174 is not transmitted to the electrode 184. In this way wiring breaks can be prevented.

To form the bent portion 180 a resist is deposited to outline the bent portion 180, and the wiring 176 is formed thereon, then the resist is removed by dry etching or wet etching. It should be noted that a material other than resist can be used as long as it can be etched.

While omitted from the drawings, a wiring protection layer being a solder resist or the like is preferably provided as the outermost layer to prevent corrosion and the like of the wiring.

The present embodiment can be applied to other embodiments, and in this case the connection portion being one part of the member electrically connecting the solder ball (external electrode) and wiring is the same as in the twelfth embodiment.

Sixteenth Embodiment

Figure 16:
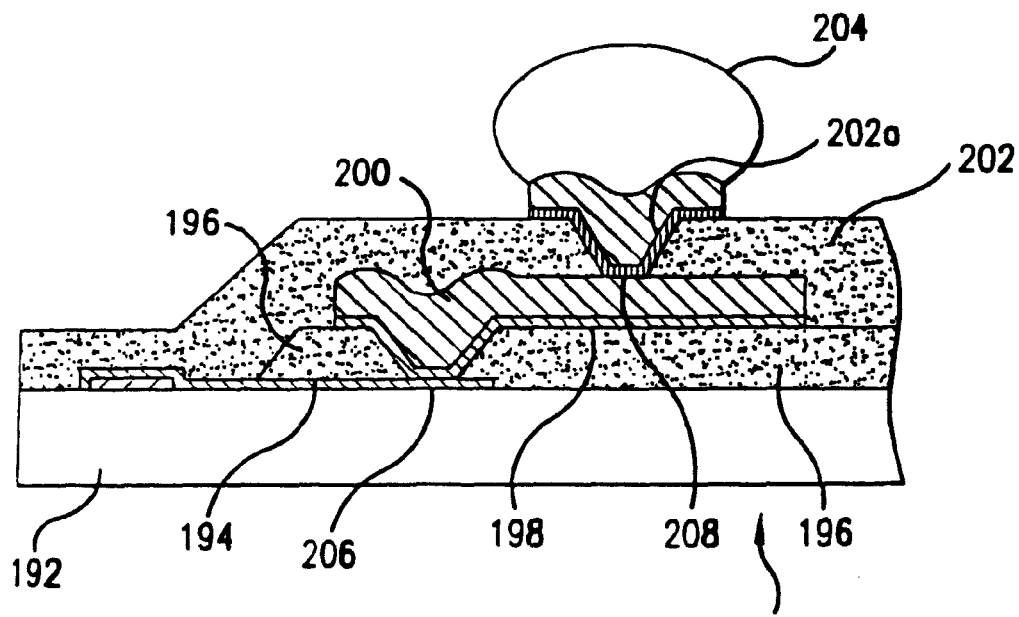
FIG. 16 shows a sixteenth embodiment of the semiconductor device.

FIG. 16 shows a sixteenth embodiment of the semiconductor device. The semiconductor device 190 shown in this figure has first wiring 194 formed on a semiconductor chip 192, a first stress relieving layer 196 formed on this wiring 194, and second wiring 198 formed on this stress relieving layer 196.

In more detail, on the first wiring 194, a hole is formed in the first stress relieving layer 196, and the second wiring 198 is formed from the first wiring 194 over the first stress relieving layer 196.

On the second wiring 198, a copper (Cu) layer 200 is formed by plating, and on this copper (Cu) layer 200, a second stress relieving layer 202 is formed. In the second stress relieving layer 202, a hole 202a is formed over the copper (Cu) layer 200. A bump 204 is provided on the copper (Cu) layer 200. Part of the bump 204 contacts the second stress relieving layer 202, and is arranged to transmit stress.

According to the present embodiment, the connection portion 206 of the first and second wiring 194 and 198 and the connection portion 208 of the second wiring 198 and the bump 204 are disposed on the different planes. Here, the connection portion 206 indicates the portion of contact between the first and second wiring 194 and 198, and the connection portion 208 indicates the portion of contact between the second wiring 198 and the bump 204. The connection portions 206 and 208 form a part of the member electrically connecting the wiring 194 and bump (external electrode) 204.

Therefore, even if stress is transmitted from the bump 204 through the connection portion 208 to the second wiring 198, this stress tends not to be transmitted to the other connection portion 206. In this way, since stress is made less likely to be transmitted to the first wiring 194, wiring breaks in this wiring 194 are prevented.

(Fabrication Process)

FIGS. 17A to 18C show a manufacturing method of a semiconductor device of the present embodiment.

Figure 17A:
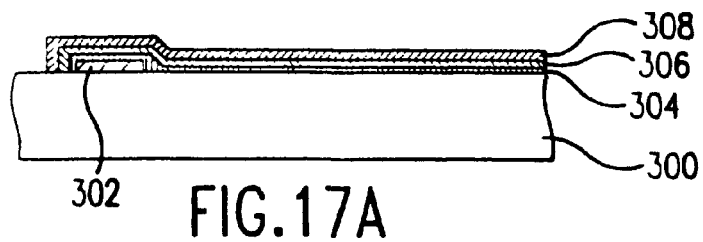
FIGS. 17A to 17E show a process of fabricating the semiconductor device of the present invention.

First, using well-known technology, normally, an electrode 302 and other elements are formed up to the state before carrying out dicing on a wafer 300 (see FIG. 17A). In the present embodiment, the electrode 302 is formed of aluminum, but equally an aluminum alloy material (for example, aluminum silicon, aluminum silicon copper, and so on) or a copper material may be used.

On the surface of the wafer 300, a passivation film (not shown in the drawings) such as an oxide layer is formed to prevent chemical change. The passivation film is formed to avoid not only the electrode 302, but also a scribing line used to carry out dicing. By not forming the passivation film on the scribing line, during dicing the creation of debris from the passivation film can be avoided, and furthermore, the generation of cracks in the passivation film can be prevented.

Next, sputtering is carried out with the wafer 300 as the target, and the foreign objects are removed from the surface of the wafer 300 (in other words, reverse sputtering).

Then, as shown in FIG. 17A, by means of sputtering a titanium tungsten (TiW) layer 304 and copper (Cu) layer 306 are superimposed on the surface of the wafer 300. It should be noted that in this fabrication process, the example described hag titanium tungsten (TiW) and copper (Cu) used for the wiring, but the present invention is not limited to this.

Figure 17B:
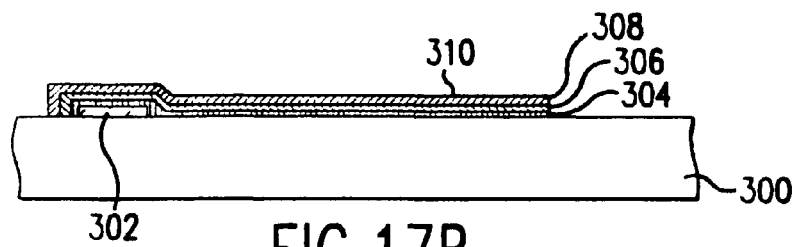

Then, when the wiring resistance is lowered, in particular on the copper layer 306, a copper plating layer 308 is formed by electroplating. The layer thicknesses may be, for example, approximately the following values:

Titanium tungsten layer: 1000 angstroms ($10^{-10}$ m)
Copper layer: 1000 angstroms ($10^{-10}$ m)
Copper plating layer: 0.5 to 5 μm Next, as shown in FIG. 17B, the titanium tungsten layer 304, copper layer 306, and copper plating layer 308 are dry etched, applying photolithography technology, to form wiring 310.

In more detail, a photoresist (not shown in the drawings) is applied on the copper plating layer 308, and prebaking, exposure and development are carried out. Drying and postbaking are carried out after washing. Then dry etching is applied to the copper plating layer 308 and copper layer 306 for rinsing, and the titanium tungsten layer 304 is dry etched. Next, the photoresist is removed and washing carried out. In this way, as shown in FIG. 17B, the wiring 310 is formed.

Figure 17C:
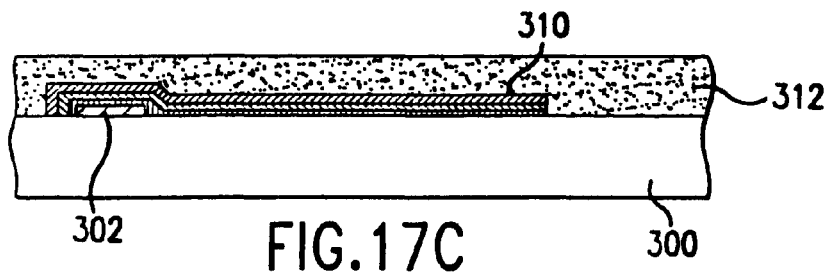

Next, the wiring 310 is subjected to ashing by an $O_2$ plasma, then after water is removed from the wafer 300, as shown in FIG. 17C, a polyimide resin 312 is applied to the whole surface of the wafer 300. The polyimide resin 312 forms a stress relieving layer same as the stress relieving layer 36 and the like shown in FIG. 2. Here, by means of the aching, the adhesion properties of the wiring 310 and wafer 300 with the polyimide resin 312 are improved.

For the polyimide resin 312, it is preferable to use one with good adhesion properties with the passivation film of the wafer 300, a low Young's modulus and a low water absorption ratio, and for which a large film thickness is possible.

Figure 17D:
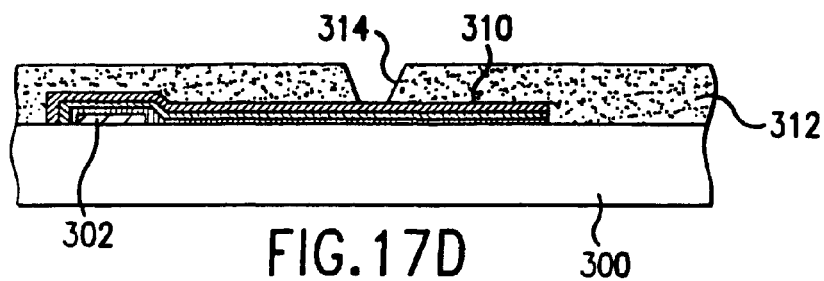

The polyimide resin 312 is now subjected to prebaking, exposure, drying, development, washing, drying and curing processes. In this way, as shown in FIG. 17D, a hole 314 is formed in the polyimide resin 312. The polyimide resin 312, while adhered to the wiring 310 and wafer 300, is shrunk by the drying and curing processes, so that the inside of the hole 314 is shaped as a 60 to 70 degree taper. Therefore, it is preferable that the polyimide resin 312 is selected so that a taper is shaped inside the hole 314.

Next, the surface of the polyimide resin 312 is subjected to ashing by an $O_2$ plasma, and sputtering is carried out with this polyimide resin 312 as the target to remove foreign objects. By means of the aching, the adhesion properties of the surface of the polyimide resin 312 with a metal film are improved.

Figure 17E:
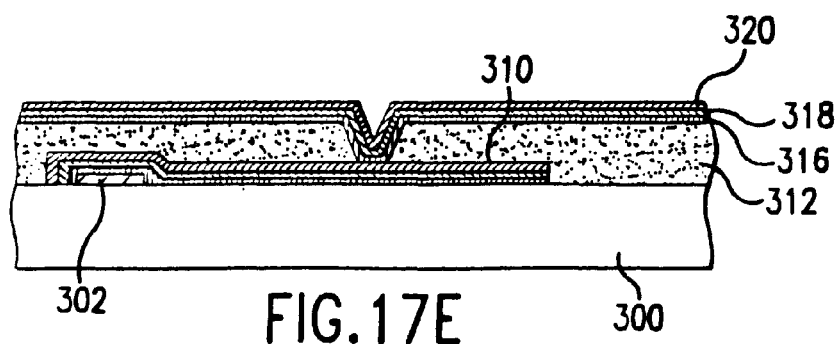

Then as shown in FIG. 17E, by sputtering applied to the whole surface of the polyimide resin 312, a titanium tungsten (TiW) layer 316 and copper (Cu) layer 318 are formed to be overlaid. Then, a copper plating layer 320 is formed on the copper layer 318 by electroplating. It should be noted that in place of the titanium tungsten layer 316, a titanium (Ti) layer may be formed. The layer thicknesses may be, for example, approximately the following values:

Titanium tungsten layer: 1000 angstroms ($10^{-10}$ m)
Copper layer: 1000 angstroms ($10^{-10}$ m)
Copper plating layer: 0.5 to 100 μm Next, a photoresist is applied on the copper plating layer 320, then the copper plating layer 320 and copper layer 318 are etched after prebaking, exposure, development, washing, drying and postbaking are carried out. Then the titanium tungsten layer 316 is etched after washing, and the photoresist is removed, and washing is carried out.

Figure 18A:
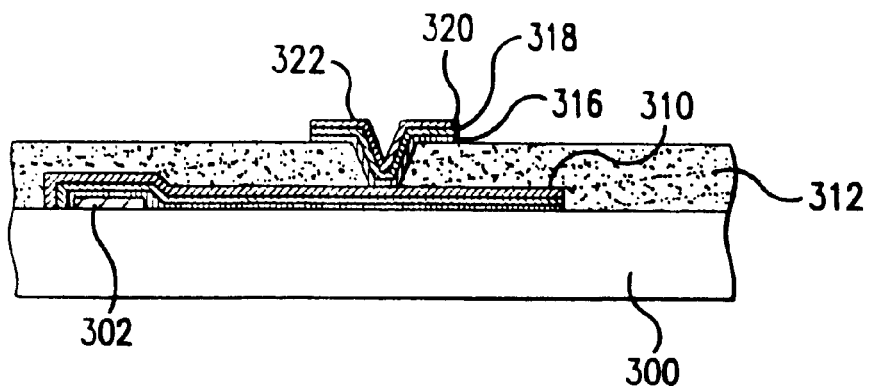
FIGS. 18A to 18C show a process of fabricating the semiconductor device of the present invention.

In this way, as shown in FIG. 18A, the stress transmission portion 322 is formed on the wiring 310. Then aching is carried out to the stress transmission portion 322 by an $O_2$ plasma.

Figure 18B:
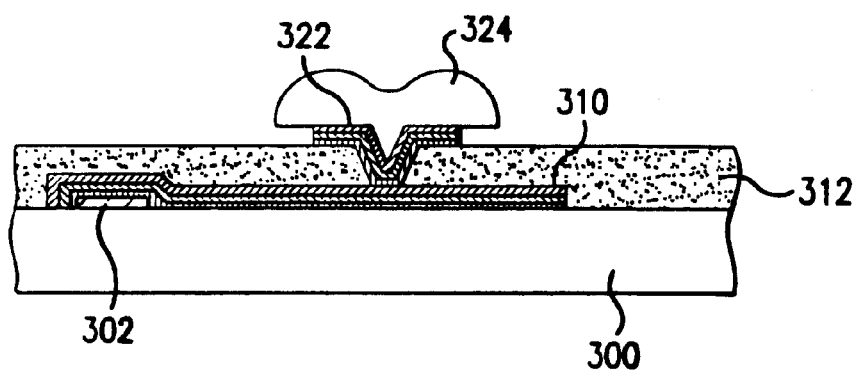

Then as shown in FIG. 18B, a solder paste 324 is disposed on the stress transmission portion 322. The solder paste 324 can be provided, for example, by screen printing. Besides, when the particle size of the solder paste 324 is of the range around 25 to 15 μm, the printing mask will be easily released. Alternatively, the solder paste 324 may be provided by a solder plating method.

Figure 18C:
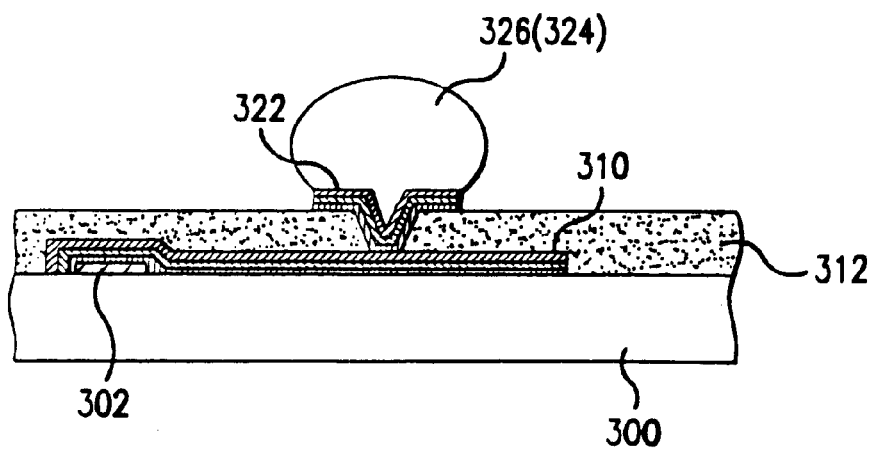

Next, through a reflow process, the solder paste 324 is melted to form a solder ball 326 by means of surface tension, as shown in FIG. 18C. Then the flux is subjected to washing.

According to the above described manufacturing method of a semiconductor device, almost all steps are completed within the stage of wafer processing. In other words, the step in which the external terminals for connection to the mounting board are formed is carried out within the stage of wafer processing, and it is not necessary to carry out the conventional packaging process, that is to say, in which individual semiconductor chips are handled, and an inner lead bonding process and external terminal formation process are carried out for each individual semiconductor chip. Besides, when the stress relieving layer is formed, a substrate such as a patterned film is not required. For these reasons, a semiconductor device of low cost and high quality can be obtained.

Other Embodiments

Figure 19:
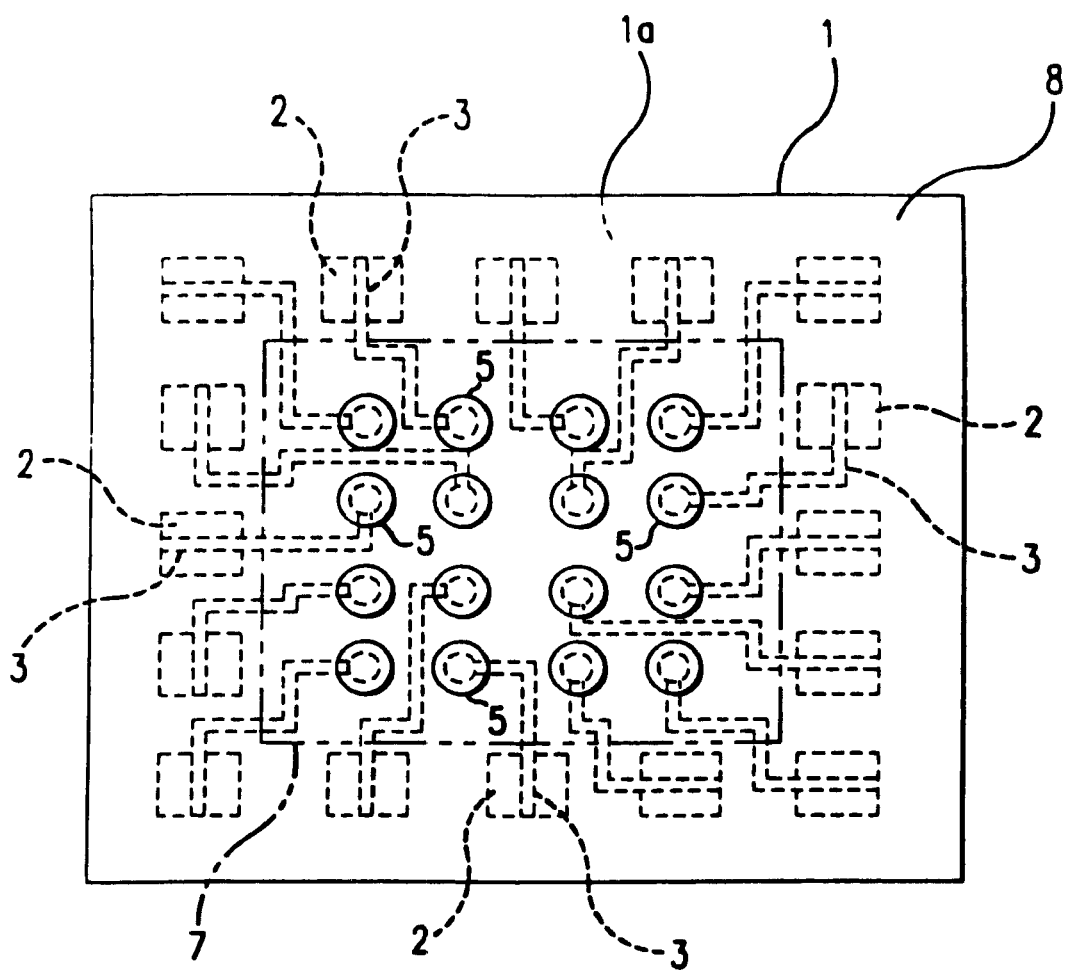
FIG. 19 shows a CSP semiconductor device.

The present invention can be applied to a CSP semiconductor device. In FIG. 19 is shown a typical CSP semiconductor device. In this figure, a semiconductor chip 1 has wiring 3 formed extending from electrodes 2 toward the center of an active surface 1a, and an external electrode 5 is provided on each wiring 3. All of the external electrodes 5 are provided on a stress relieving layer 7, so that the stresses can be relieved when mounted on a circuit board (not shown in the drawings). Besides, excluding the region of the external electrodes 5, a solder resist layer 8 is formed as a protective film.

The stress relieving layer 7 is formed at least in the region surrounded by the electrodes 12. It should be noted that the electrodes 2 refer to the portions connected to the wiring 3. Besides, when the area required to form the external electrodes 5 is considered, although not shown in FIG. 19, the stress relieving layer 7 may be provided on the outside of the electrodes 2, and the wiring 3 brought around thereon, to provide the external electrodes 5 in the same way.

The electrodes 2 are positioned around the periphery of the semiconductor chip 1, in an example of the so-called peripheral electrode type, however, equally an area array type of semiconductor chip in which the electrodes are formed in a region inside the periphery of the semiconductor chip may be used. In this case, the stress relieving layer 7 may be formed to avoid at least a portion of the electrodes 2.

As shown in this drawing, the external electrodes 5 are provided not on the electrodes 2 of the semiconductor chip 1, but in the active region (the region in which the active elements are formed) of the semiconductor chip 1. By providing the stress relieving layer 7 in the active region, and further positioning (bringing in) the wiring 3 within the active region, the external electrodes 5 can be provided within the active region. That is to say, a pitch conversion can be carried out. As a result, when laying out the external electrodes 5, the interior of the active region, that is to say, a region of a particular plane can be provided. Thus the flexibility for positioning the external electrodes 5 is greatly increased.

By bending the wiring 3 at the required position, the external electrodes 5 can be aligned in a lattice. It should be noted that this is not an essential construction of the present invention, and therefore the external electrodes 5 do not necessarily have to be disposed in a lattice.

In FIG. 19, at the junction of the electrodes 2 and wiring 3 the size of the electrodes 2 and the size of the wiring 3 are such that:
wiring 3<electrodes 2
but it is preferable that:
electrodes 2≦wiring 3
In particular, in the case that:
electrodes 2<wiring 3
not only is the resistance of the wiring 3 reduced, but also, since the strength is increased, wiring breaks are prevented.

In each of the above described embodiments, in cases where external stress applied to the solder ball is concentrated in the wiring, the wiring is designed to be curved (or bent) in the planar direction, and in addition to or separate from this, a bent (curved) structure as in the fifteenth embodiment is adopted to each embodiment, so that concentration of stress on the wiring is dispersed.

In such a semiconductor device, almost all steps can be completed within the stage of wafer processing. More specifically, a plurality of electrodes 2 are formed on the wafer, and a stress relieving layer 7 is disposed on the wafer avoiding the electrodes 2, and individual semiconductor devices are cut from the wafer after gone through the process of forming wiring 3 from the electrodes 2.

Here, for the formation of the electrodes 2 and wiring 3, for example, sputtering, etching, or other thin metal film forming technology can be applied. For the formation of the external electrodes 5, a solder plating process can be applied. Furthermore, for the formation and processing of the stress relieving layer 7, a photolithography in which a photosensitive resin is exposed and developed can be applied. These steps can all be carried out during wafer processing.

In this way, after carrying out almost all of the steps in wafer processing, the individual semiconductor devices are cut. By doing this the stress relieving layer 7, wiring 3, and external electrodes 5 of a plurality of semiconductor devices can be formed simultaneously. As a result, the fabrication process can be simplified.

Figure 20:
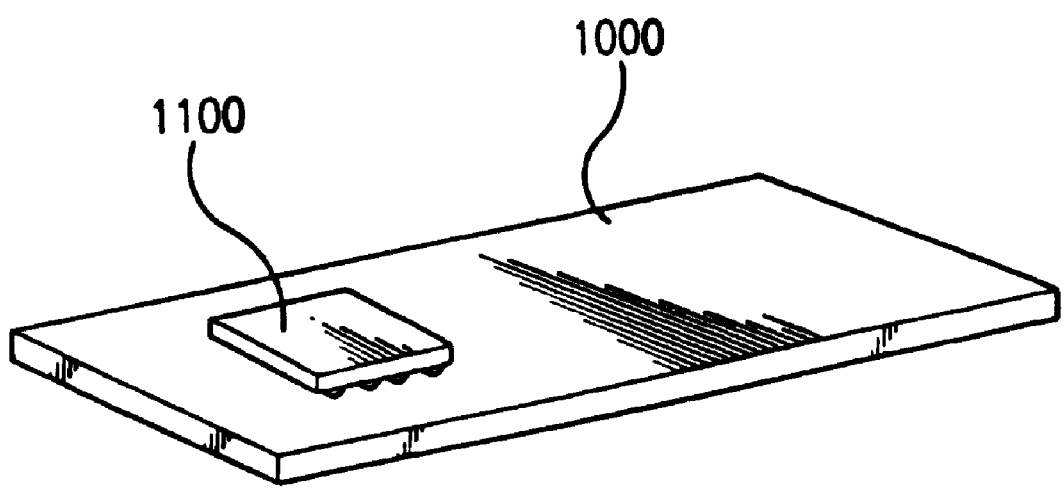
FIG. 20 shows a circuit board mounted with a semiconductor device fabricated by application of the method of the present invention.

In FIG. 20 is shown a circuit board 1000 on which is mounted a semiconductor device 1100 fabricated by the method of the above described embodiment. The circuit board generally uses an organic compound substrate such as glass epoxy. A wiring pattern of, for example, copper is formed on the circuit board to form a desired circuit. The electrical connection is achieved by mechanical connection of the wiring pattern and the external terminals of the semiconductor device. In this case, since the above described semiconductor device has a construction for absorbing strain generated by differences in thermal expansion with the exterior provided by the stress relieving portion, when this semiconductor device is mounted on the circuit board and thereafter, the reliability can be improved. Besides, if appropriate attention is paid to the wiring of the semiconductor device, the reliability during connection and the reliability after connection can be improved. It should be noted that the mounting area can also be reduced to the area for mounting as a bare chip. Therefore, when this circuit board is used in an electronic instrument, the electronic instrument itself can be made more compact. Besides, within the same area, greater effective mounting space can be made available, and it is possible to design for greater functionality.

Figure 21:
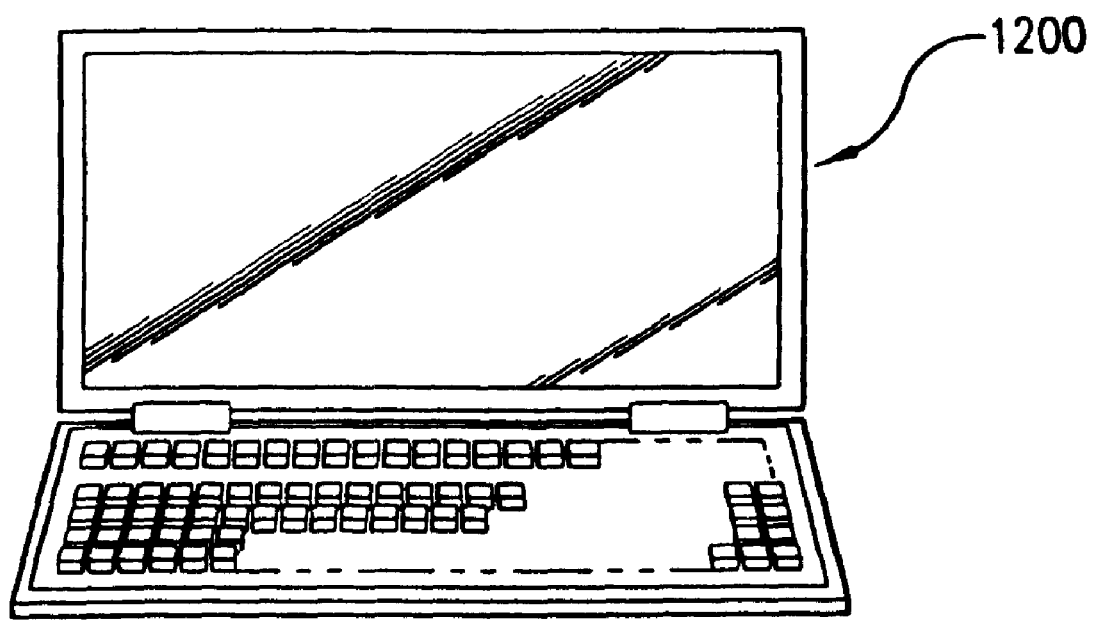
FIG. 21 shows an electronic instrument equipped with a circuit board mounted with a semiconductor device fabricated by application of the method of the present invention.

Next, as an electronic instrument provided with this circuit board 1000, FIG. 21 shows a notebook personal computer 1200.

It should be noted that the above described embodiments apply the present invention to a semiconductor device, but the present invention can be applied to any surface-mounted electronic component, whether active or passive. Electronic components include, for example, resistors, capacitors, coils, oscillators, filters, temperature sensors, thermistors, varistors, variable resistors, and fuses. In addition, by using given electronic element in place of the semiconductor element in the above described embodiments, and by forming the same kind of stress transmission portion as in the above described embodiments, stress can be relieved by the stress relieving portion, and wiring breaks and the like can be prevented. Since the manufacturing method is the same as in the above described embodiment, description is omitted.

The invention claimed is:

1. An electronic component comprising:
an electronic element;
an electrode that is formed on a first surface of the electronic element;
a first resin layer that is formed over the first surface of the electronic element;
a wiring that is electrically connected to the electrode, a first portion of the wiring extending over the first resin layer;
a second resin layer that is formed over the first resin layer and the wiring, the second resin layer having an opening, the opening overlapping the first portion of the wiring, wherein the opening is filled with a conductive material, the conductive material having a contact portion that contacts with the first portion of the wiring;
an external terminal that is provided above the contact portion, the external terminal being connected to the first portion of the wiring via the contact portion, wherein a central vertical axis of the conductive material is substantially the same as a central vertical axis of the external terminal; and
a third resin layer that is formed over the second resin layer, the third resin layer being provided around the external terminal.

2. The electronic component of claim 1, wherein at least one of the first, second and third layers has a Young's modulus of less than 20 kg/mm$^2$.

3. The electronic component of claim 1, wherein at least one of the first, second and third resin layers is formed from a material selected from the group consisting of polyimide resin, silicone denatured polyimide resin, epoxy resin and silicone denatured epoxy resin.

4. A circuit board having the electronic component of claim 1 and a substrate on which a wiring pattern is formed, wherein the external terminal is connected to the wiring pattern.

5. An electronic instrument having the electronic component of claim 1.

6. An electronic component comprising:
an electronic element;
an electrode that is formed on a first surface of the electronic element;
a wiring that is electrically connected to the electrode, the wiring being formed over the first surface of the electronic element;
a first resin layer that is formed over the first surface of the electronic element and the wiring, the first resin layer having an opening, the opening overlapping a first portion of the wiring,
wherein the opening is filled with a conductive material, the conductive material having a contact portion that contacts with the first portion of the wiring;
an external terminal that is provided above the contact portion, the external terminal being connected to the first portion of the wiring via the contact portion, wherein a central vertical axis of the conductive material is substantially the same as a central vertical axis of the external terminal; and
a second resin layer that is formed over the first resin layer, the second resin layer being provided around the external terminal.

7. The electronic component of claim 6, wherein at least one of the first and second resin layers has a Young's modulus of less than 20 kg/mm$^2$.

8. The electronic component of claim 6, wherein at least one of the first and second resin layers is formed from a material selected from the group consisting of polyimide resin, silicone denatured polyimide resin, epoxy resin and silicone denatured epoxy resin.

9. A circuit board having the electronic component of claim 6 and a substrate on which a wiring pattern is formed, wherein the external terminal is connected to the wiring pattern.

10. An electronic instrument having the electronic component of claim 6.

11. A semiconductor device comprising:
a semiconductor element;
an electrode that is formed on a first surface of the semiconductor element;
a first resin layer that is formed over the first surface of the semiconductor element;
a wiring that is electrically connected to the electrode, a first portion of the wiring extending over the first resin layer;
a second resin layer that is formed over the first resin layer and the wiring, the second resin layer having an opening, the opening overlapping the first portion of the wiring,
wherein the opening is filled with a conductive material, the conductive material having a contact portion that contacts with the first portion of the wiring;
an external terminal that is provided above the contact portion, the external terminal being connected to the first portion of the wiring via the contact portion,
wherein a central vertical axis of the conductive material is substantially the same as a central vertical axis of the external terminal; and
a third resin layer that is formed over the second resin layer, the third resin layer being provided around the external terminal.

12. The semiconductor device of claim 11, wherein at least one of the first, second and third resin layers has a Young's modulus of less than 20 kg/mm².

13. The semiconductor device of claim 11, wherein at least one of the first, second and third resin layers is formed from a material selected from the group consisting of polyimide resin, silicone denatured polyimide resin, epoxy resin and silicone denatured epoxy resin.

14. A circuit board having the semiconductor device of claim 11 and a substrate on which a wiring pattern is formed, wherein the external terminal is connected to the wiring pattern.

15. An electronic instrument having the semiconductor device of claim 11.

16. A semiconductor device comprising:
a semiconductor element;
an electrode that is formed on a first surface of the semiconductor element;
a wiring that is electrically connected to the electrode, the wiring being formed over the first surface of the semiconductor element;
a first resin layer that is formed over the first surface of the semiconductor element and the wiring, the first resin layer having an opening, the opening overlapping a first portion of the wiring,
wherein the opening is filled with a conductive material, the conductive material having a contact portion that contacts with the first portion of the wiring;
an external terminal that is provided above the contact portion, the external terminal being connected to the first portion of the wiring via the contact portion,
wherein a central vertical axis of the conductive material is substantially the same as a central vertical axis of the external terminal; and
a second resin layer that is formed over the first resin layer, the second resin layer being provided around the external terminal.

17. The semiconductor device of claim 16, wherein at least one of the first and second resin layers has a Young's modulus of less than 20 kg/mm².

18. The semiconductor device of claim 16, wherein at least one of the first and second resin layers is formed from a material selected from the group consisting of polyimide resin, silicone denatured polyimide resin, epoxy resin and silicone denatured epoxy resin.

19. A circuit board having the semiconductor device of claim 16 and a substrate on which a wiring pattern is formed, wherein the external terminal is connected to the wiring pattern.

20. An electronic instrument having the semiconductor device of claim 16.

* * * * *